US007012447B2

(12) United States Patent
Yamauchi et al.

(10) Patent No.: US 7,012,447 B2
(45) Date of Patent: Mar. 14, 2006

(54) SIGNAL TRANSMITTING RECEIVING APPARATUS

(75) Inventors: Hiroyuki Yamauchi, Osaka (JP); Tadahiro Yoshida, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 73 days.

(21) Appl. No.: 10/708,238

(22) Filed: Feb. 18, 2004

(65) Prior Publication Data

US 2004/0165668 A1 Aug. 26, 2004

Related U.S. Application Data

(62) Division of application No. 09/553,308, filed on Apr. 20, 2000, now Pat. No. 6,768,334.

(30) Foreign Application Priority Data

Apr. 21, 1999 (JP) ................................ 11-113265

(51) Int. Cl.
*H03K 19/003* (2006.01)

(52) U.S. Cl. .......................................... 326/30; 326/33

(58) Field of Classification Search .................. 326/30, 326/31, 80–83, 86, 21
See application file for complete search history.

(56) References Cited

U.S. PATENT DOCUMENTS 3,739,188 A 6/1973 Froehling
3,825,682 A 7/1974 Phillips
5,553,250 A 9/1996 Miyagawa et al.
5,568,064 A * 10/1996 Beers et al. .................. 326/31
5,578,939 A 11/1996 Beers et al.
5,781,028 A 7/1998 Decuir
6,034,551 A 3/2000 Bridgewater, Jr.
6,114,898 A * 9/2000 Okayasu ..................... 327/437

FOREIGN PATENT DOCUMENTS

JP 58-092139 6/1983
JP 05-046291 2/1993
KR 140029 1/1995
KR 1996-0030605 8/1996
WO WO 96/36114 11/1996

* cited by examiner

*Primary Examiner*—James H. Cho
(74) *Attorney, Agent, or Firm*—Snell & Wilmer L.L.P.

(57) ABSTRACT

A signal transmitting/receiving apparatus according to the present invention includes: a transmitting device for transmitting data; a receiving device for receiving the data; a data line for transmitting the data; and a supply line for transmitting a bias voltage for determining a voltage of the data line, wherein the transmitting device and the receiving device are connected to each other through the data line and the supply line, the transmitting device including: a driver circuit for outputting the data to the data line; and a bias generating means for generating the bias voltage and outputting the bias voltage to the supply line, the receiving device including: a terminating resistor connected to the data line; and a receiver circuit for detecting the data from the data line, wherein the data line is connected to the supply line via the terminating resistor.

25 Claims, 19 Drawing Sheets

SIGNAL TRANSMITTING RECEIVING APPARATUS

CROSS REFERENCE TO RELATED APPLICATIONS

This application is a divisional of and claims benefit priority to U.S. Non-Provisional patent application Ser. No. 09/553,308, filed on Apr. 20, 2000, now U.S. Pat. No. 6,768,334, and also entitled "Signal Transmitting/Receiving Apparatus", which application is hereby incorporated by reference.

FIELD OF INVENTION

The present invention relates to an apparatus for transmitting/receiving signals between appliances or chips, and more specifically the present invention is suitable for a signal transmitting/receiving apparatus which requires a stable data transmission/reception using cables and flexible substrates even if supply voltages and ground voltages are different between a transmitting apparatus and a receiving apparatus such as in the case where signals are transmitted/received between devices (e.g., LSI or IC) mounted on a board, between different boards in an appliance, or between different appliances.

BACKGROUND OF INVENTION

In conventional signal transmission/reception, e.g., differential transmission, waveform irregularities such as reflection is prevented by impedance match between transmission paths, as in a signal transmitting/receiving apparatus 1000 shown in FIG. 9A. In order to achieve this impedance match, a receiving device 130 is provided with: a terminating resistor 105 for short circuiting a pair of differential lines 103A and 103C (i.e., data lines); and a bias generating circuit 102 for determining an intermediate potential between differential potentials, where the output of the bias generating circuit 102 is connected at a midpoint of the terminating resistor 105. This will set the intermediate potential of the pair of differential lines 103A and 103C to Vcm, which is a bias voltage output from the bias generating circuit 102, whereby the problem of waveform irregularities such as the reflection between the pair of differential lines 103A and 103C is solved. In the case where the difference between a supply voltage VCC1 of a transmitting device 120 and a supply voltage VCC2 of a receiving device 130 and the difference between a ground voltage GND1 of the transmitting device 120 and a ground voltage GND2 of the receiving device 130 are not large, the intermediate potential between the pair of the differential lines 103A and 103C of a transmitting device 120 is also around Vcm.

The amplitude potential of the pair of differential lines 103A and 103C is determined by a value of a current flowing through the differential lines 103A and 103C, and by a value of the terminating resistor 105. Since the impedance of the differential lines 103A and 103C is usually 110 Ω, the value of the terminating resistor 105 is also set to 110 Ω for impedance matching. Thus, when a driver circuit 101 of the transmitting device 120 applies a 2 mA current to the transmission path 110, the amplitude voltage of the differential lines 103A and 103C will be 220 mV. If the bias potential is 2.0 V, the higher potential of the differential lines 103A and 103C will be 2.11 V (2.0 V+220 mV/2), and the lower potential of the differential lines 103A and 103C will be 1.89 V (2.0 V−220 mV/2).

Therefore, if the driver circuit 101 of the transmitting device 120 applies a stable 2 mA current to the higher output terminal (2.11 V) of output terminals A and C, data can be transmitted efficiently at a high-speed of 400 MHz or greater in the form of a small amplitude transmission of 220 mV. If the supply potential VCC1 of the driver circuit 101 is sufficiently higher than the potential of the higher output terminal (the potential corresponding to Vd of the driver circuit 101 in FIG. 11 is 2.11 V), a current can be applied from a PMOS transistor 1101 in a driver circuit 101 (as shown in FIG. 11) to the output terminal A or C. Therefore, data can be transmitted efficiently at a high-speed of 400 MHz or greater in the form of a small amplitude transmission of 220 mV, as mentioned above.

However, in the case where the difference between the supply voltage VCC1 of the transmitting device 120 and the supply voltage VCC2 of the receiving device 130, and the difference between the ground voltage GND1 of the transmitting device 120 and the ground voltage GND2 of the receiving device 130 are relatively large, the potentials of the output terminals A and C of the driver circuit 101 of the transmitting device 120 (i.e., the potential of the transmission paths 110) may become infinitely close to the supply voltage VCC1 of the driver circuit 101, or even higher than the supply voltage VCC1 of the driver circuit 101, thereby making it difficult or impossible to apply a current from the driver circuit 101 to the transmission path 110. In other words, such a state causes a problem of not being able to transmit data.

FIG. 9B illustrates the problem caused by the difference between the ground potential GND1 of the transmitting device 120 and the ground potential GND2 of the receiving device 130 in the signal transmitting/receiving circuit 1000 shown in FIG. 9A. FIG. 10B illustrates the problem caused by the difference between a supply voltage VCC1 of a transmitting device 220 and a supply voltage VCC2 of a receiving device 230 in a signal transmitting/receiving circuit 2000 as shown in FIG. 10A. These problems will now be more specifically described in reference to FIGS. 9A through 10B.

FIGS. 9A and 9B show the case where the ground potential GND1 of the transmitting device 120 and the ground potential GND2 of the receiving device 130 are different. More specifically, it is assumed that the ground potential GND2 of the receiving device 130 is higher than the ground potential GND1 of the transmitting device 120. In this case, as shown in FIG. 9B, if the intermediate potential Vcm of the pair of differential lines 103A and 103C becomes higher than the supply voltage VCC1 of the driver circuit 101 of the transmitting device 120, it is impossible to apply a current. This difference between the ground potentials (GND2−GND1) is prone to occur when data is transmitted/received between different appliances grounded at different sites. A typical example of this is the case where the transmitting device 120 is a floor model VCR whose power is supplied from an outlet. In such a case, the ground potential GND1 is determined by the ground potential of the outlet. If the corresponding receiving device 130 is a video camera operating on an internal battery, the ground of the video camera is only connected to the housing of the video camera. Therefore, the ground of the camera will be a ground potential GND2, which may inevitably be different from the ground potential of the outlet. In the case where the power is supplied from such a floor model VCR to such a video camera via a cable (esp. IEEE 1394 and the like), the ground potential GND2 of the video camera may become about 0.5 V to 1.0 V higher than the ground potential GND1 of the floor model VCR (i.e., GND2=GND1+0.5 V to 1.0 V) due to the cable resistance.

In this case, the intermediate potential Vcm generated by the receiving device 130 appears higher (e.g., 0.5 V to 1.0 V) than the ground potential GND1 of the transmitting device 120, with a general tendency as shown in FIG. 9B. For example, if the intermediate potential is set at 2.0 V in the receiving device 130, it will become 2.5 V to 3.0 V in the transmitting device 120. If the supply voltage VCC1 of the driver circuit 101 in the transmitting device 120 is set at 2.5 V, the potential Vd shown in FIG. 11 will be, for example, 2.61 V to 3.11 V, which means VCC1≦Vd. Therefore, a problem exists when the PMOS transistor 1101 shown in FIG. 11 is not able to apply a current to the output terminals A and C.

FIG. 10A shows the case where the supply voltage VCC1 of the transmitting device 220 and the supply voltage VCC2 of the receiving device 230 are different. More specifically, it is assumed that the supply voltage VCC2 of the receiving device 230 is higher than the supply voltage VCC1 of the transmitting device 220. In this case, as shown in FIG. 10B, the intermediate potential Vcm of the cable becomes higher than the supply voltage VCC1 of a driver circuit 201 in the transmitting device 220, so that it is impossible to apply a current.

In a transmitting/receiving apparatus used for a digital video disc apparatus and the like (where a signal processing LSI corresponds to the transmitting device 220 and a servomotor controlling IC corresponds to the receiving device 230), this difference between the supply voltages (VCC2−VCCL) is inevitable from the system designing point of view. The most crucial reason for this is as follows: with a view to reducing the cost and the mounting area, there is a trend for developing highly integrated single-chip transmitting devices for utilizing the most recent device technologies. This, in turn, is because a signal processing LSI in a transmitting device can be implemented as digital circuits, so that the signal processing LSI can be mounted on a single chip together with a variety of other digital processing LSIs. Therefore, as shown in FIG. 12, the CMOS devices' supply voltage has been reduced over generations, e.g., from 5.0 V to 3.0 V, 3.0 V to 2.5 V, 2.5 V to 1.8 V, and so on.

On the other hand, as to ICs for controlling a servomotor associated with a receiving device, their supply voltage has not been changed over generations, but rather has remained constant at 5.0 V. This is because such an IC is usually a bipolar device, which is an analog circuit formed of semiconductors for driving mechanical systems such as a servomotor. Moreover, since such an IC is seldom required to incorporate a new function in each product generation, its design is usually not changed for five years or so, once designed. Therefore, it is impractical to change the circuits in the receiving device. In view of such a trend, FIGS. 10A and 10B represent the case where the supply voltage VCC2 of the receiving device 230 is higher than the supply voltage VCC1 of the transmitting device 220.

If the receiving device 230 is designed so that the intermediate potential Vcm is ½ of the supply voltage, then Vcm will be 2.5 V=(5 V×½). Therefore, with reference to FIG. 10B, those skilled in the art will readily understand that the supply voltage VCC1 of the transmitting device 220 should be set lower than 3.3 V if the design rule is 0.25 $\mu$m or less in order to achieve a high integration. If the design of the receiving circuit is changed each time the design of the transmitting circuit is changed, this problem can of course be solved to some degree. It is, however, impractical to reduce the product life of the IC only for the sake of redesigning the intermediate potential Vcm when there is no need to incorporate a new function, since it causes a cost increase. Moreover, in the case where only a low supply voltage is available to the transmitting device, the value of the intermediate potential Vcm may have to be set at 1.0 V or less. In this case, the circuits in the receiving device require a drastic redesign since an intermediate potential Vcm has to be set at 1.0 V or lower with a supply voltage of 5 V. It is readily understood this causes cost increase and unstable operation problem.

SUMMARY OF INVENTION

In one aspect of the invention, signal transmitting/receiving apparatus includes: a transmitting device for transmitting data; a receiving device for receiving the data; a data line for transmitting the data; and a supply line for transmitting a bias voltage for determining a voltage of the data line, wherein the transmitting device and the receiving device are connected to each other through the data line and the supply line, the transmitting device including: a driver circuit for outputting the data to the data line; and a bias generating means for generating the bias voltage and outputting the bias voltage to the supply line, the receiving device including: a terminating resistor connected to the data line; and a receiver circuit for detecting the data from the data line, wherein the data line is connected to the supply line via the terminating resistor.

In another embodiment of the invention, the bias generating means includes a bias generating circuit and a reference voltage generating circuit.

In still another embodiment of the invention, the data line includes a pair of differential lines.

In still another embodiment of the invention, the terminating resistor is connected so as to short circuit between the pair of differential lines, and the supply lines are connected at substantially a midpoint of the terminating resistor.

In still another embodiment of the invention, the transmitting device has a first ground potential; and the receiving device has a second ground potential, the second ground potential being higher than the first ground potential.

In still another embodiment of the invention, the transmitting device has a first supply potential; and the receiving device has a second supply potential, the second supply potential being higher than the first supply potential.

In still another embodiment of the invention, a signal transmitting/receiving apparatus further includes a ground interconnect line for connecting a ground of the transmitting device and a ground of the receiving device.

In still another embodiment of the invention, at least one of the data line and the supply line has flexibility.

In still another embodiment of the invention, the ground interconnect line has flexibility.

In one aspect of the invention, a transmitting device is connected to a data line which transmits data and a supply line which transmits a bias voltage for determining a voltage of the data line, the transmitting device transmitting the data to a receiving device wherein: the receiving device includes a terminating resistor connected to the data line and a receiver circuit for detecting the data from the data line; and the data line is connected to the supply line through the terminating resistor, the transmitting device including: a driver circuit for outputting the data to the data line; and bias generating means for generating the bias voltage and outputting the bias voltage to the supply line.

In one embodiment of the invention, the bias generating means includes a bias generating circuit and a reference voltage generating circuit.

In another embodiment of the invention, a transmitting device is further connected to a ground interconnect line for transmitting a ground potential of the transmitting device to the receiving device.

In one aspect the invention, a receiving device is connected to a data line which transmits data and a supply line which transmits a bias voltage for determining a voltage of the data line, the receiving device receiving the data from a transmitting device wherein: the transmitting device includes a driver circuit for outputting the data to the data line and bias generating means for generating the bias voltage and outputting the bias voltage to the supply line, the receiving device including: a terminating resistor connected to the data line; and a receiver circuit for detecting the data from the data line, the terminating resistor connecting the data line and the supply line.

In one embodiment of the invention, the bias generating means includes a bias generating circuit and a reference voltage generating circuit.

In another embodiment of the invention, the data line includes a pair of differential lines; the terminating resistor short circuits between the pair of differential lines; and the bias voltage is applied at substantially a midpoint of the terminating resistor.

In still another embodiment of the invention, a receiving device is further connected to a ground interconnect line which transmits a ground potential of the transmitting device.

In one aspect of the invention, a signal transmitting/receiving apparatus includes: a transmitting device for transmitting a first data and a second data; a receiving device for receiving the first data and the second data; a data line for transmitting the first data and the second data; wherein the transmitting device and the receiving device are connected to each other through the data line, the transmitting device including: a driver circuit for outputting the first data to the data line; and a circuit for outputting the second data to the data line, the receiving device including: a terminating resistor connected to the data line; a receiver circuit for detecting the first data from the data line; and a bias generating means for generating a bias voltage applied to the terminating resistor, the bias generating means setting the bias voltage based on the second data from the data line.

In one embodiment of the invention, the bias generating means includes a bias generating circuit and a reference voltage generating circuit.

In another embodiment of the invention, the data line for transmitting the first data and the data line for transmitting the second data are different.

In still another embodiment of the invention, the data line includes a pair of differential lines.

In still another embodiment of the invention, the data line for transmitting the first data includes a pair of differential lines.

In still another embodiment of the invention, the terminating resistor is connected so as to short circuit between the pair of differential lines, and the bias voltage is applied at substantially a midpoint of the terminating resistor.

In still another embodiment of the invention, the terminating resistor is connected so as to short circuit between the pair of differential lines, and the bias voltage is applied at substantially a midpoint of the terminating resistor.

In still another embodiment of the invention, a signal transmitting/receiving apparatus further includes a ground interconnect line for connecting a ground of the transmitting device and a ground of the receiving device.

In still another embodiment of the invention, the data line has flexibility.

In still another embodiment of the invention, the ground interconnect line has flexibility.

In one aspect of the invention, a transmitting device is connected to a data line which transmits the first data and the second data to a receiving device, wherein, the receiving device includes: a terminating resistor connected to the data line; a receiver circuit for detecting the first data from the data line; and a bias generating means for generating a bias voltage to be applied to the terminating resistor based on the second data from the data line, the transmitting device including: a driver circuit for outputting the first data to the data line; and a circuit for outputting the second data to the data line.

In one embodiment of the invention, the bias generating means includes a bias generating circuit and a reference voltage generating circuit.

In another embodiment of the invention, the data line for transmitting the first data and the data line for transmitting the second data are different.

In still another embodiment of the invention, a transmitting device is further connected to a ground interconnect line for transmitting a ground potential of the transmitting device to the receiving device.

In another embodiment of the invention, the data line includes a pair of differential lines, and the terminating resistor is connected so as to short circuit between the pair of differential lines, whereby the bias voltage is applied at substantially a midpoint of the terminating resistor.

In one aspect of the invention, a receiving device is connected to a data line which transmits first data and second data for receiving the first data and the second data from a transmitting device, the transmitting device including: a driver circuit for outputting the first data to the data line; and a circuit for outputting the second data to the data line, the receiving device including: a terminating resistor connected to the data line; a receiver circuit for detecting the data from the data line; and a bias generating means for generating a bias voltage and outputting the bias voltage to the terminating resistor, wherein the bias generating means sets the bias voltage based on the second data from the data line.

In one embodiment of the invention, the bias generating means includes a bias generating circuit and a reference voltage generating circuit.

In another embodiment of the invention, the data line for transmitting the first data and the data line for transmitting the second data are different.

In still another embodiment of the invention, the data line includes a pair of differential lines; the terminating resistor short circuits between the pair of differential lines; and the bias voltage is applied at substantially a midpoint of the terminating resistor.

In still another embodiment of the invention, a receiving device is further connected to a ground interconnect line which transmits a ground voltage of the transmitting device.

In one aspect of the invention, a signal transmitting/receiving apparatus includes: a transmitting device for transmitting data; a receiving device for receiving the data; and a data line for transmitting the data, wherein the transmitting device and the receiving device are connected to each other through the data line, the transmitting device including a driver circuit for outputting the data to the data line, the receiving device including: a terminating resistor connected to the data line; a receiver circuit for detecting the data from the data line; and a bias generating means for generating a bias voltage to be applied to the terminating resistor, the bias generating means setting the bias voltage based on the potential of the data line.

In one embodiment of the invention, the bias generating means includes a bias generating circuit and a reference voltage generating circuit.

In another embodiment of the invention, the data line includes a pair of differential lines.

In still another embodiment of the invention, the terminating resistor is connected so as to short circuit between the pair of differential lines, whereby the bias voltage is applied to substantially a midpoint of the terminating resistor.

In still another embodiment of the invention, a signal transmitting/receiving apparatus further includes a ground interconnect line for connecting a ground of the transmitting device and a ground of the receiving device.

In still another embodiment of the invention, the data line has flexibility.

In still another embodiment of the invention, the ground interconnect line has flexibility.

In one aspect of the invention, a receiving device is connected to a data line which transmits data, so as to receive the data from a transmitting device, the transmitting device including a driver circuit for outputting the data to the data line, the receiving device including: a terminating resistor connected to the data line; a receiver circuit for detecting the data from the data line; and a bias generating means for generating the bias voltage and outputting the bias voltage to the terminating resistor, the bias generating means setting the bias voltage based on a potential of the data line.

In one embodiment of the invention, the bias generating means includes a bias generating circuit and a reference voltage generating circuit.

In another embodiment of the invention, the data line includes a pair of differential lines; the terminating resistor short circuits between the pair of differential lines; and the bias voltage is applied at substantially a midpoint of the terminating resistor.

In still another embodiment of the invention, a receiving device is further connected to a ground interconnect line which transmits a ground potential of the transmitting device.

In one aspect of the invention, a signal transmitting/receiving apparatus includes a transmitting device for transmitting a plurality of data; a receiving device for receiving the plurality of data: a plurality of data lines for transmitting the plurality of data; and at least one supply line for transmitting a bias voltage for determining a voltage of the plurality of data lines, wherein the transmitting device and the receiving device are connected to each other through the plurality of data lines and the at least one supply line, the transmitting device including: a plurality of driver circuits for outputting the plurality of data to the plurality of corresponding data lines, respectively; and at least one bias generating means for generating the bias voltage and outputting the bias voltage to the at least one supply line, the receiving device including: a plurality of terminating resistors connected to the plurality of corresponding data lines, respectively; and a plurality of receiver circuits for detecting the plurality of data from the plurality of data lines, respectively, the plurality of data lines are connected to the at least one of corresponding supply line through the plurality of terminating resistors.

In one embodiment of the invention, at least one of the plurality of terminating resistors and the at least one supply line are connected through an electric resistance.

In another embodiment of the invention, at least one of the plurality of terminating resistors and the at least one supply line are connected through an amplifier.

In one aspect of the invention, a signal transmitting/receiving apparatus includes a transmitting device for transmitting a plurality of first data and at least one second data; a receiving device for receiving the plurality of first data and the at least one second data; and a plurality of data lines for transmitting the plurality of first data and the at least one second data, wherein the transmitting device and the receiving device are connected to each other through the plurality of data lines, the transmitting device including: a plurality of driver circuits for outputting the plurality of first data to the plurality of corresponding data lines, respectively; and at least one circuit for transmitting the at least one second data to the plurality of data lines, the receiving device including: a plurality of terminating resistors connected to the plurality of corresponding data lines, respectively; and a plurality of receiver circuits for detecting the plurality of first data from the plurality of data lines, respectively, at least one bias generating means for generating a bias voltage to be applied to the plurality of terminating resistors, the at least one bias generating means setting the bias voltage based on the at least one second data from the plurality of data lines.

In one embodiment of the invention, at least one of the plurality of terminating resistors and the at least one bias generating means are connected through an electric resistance.

In another embodiment of the invention, at least one of the plurality of terminating resistors and the at least one bias generating means are connected through an amplifier.

In one aspect of the invention, a signal transmitting/receiving apparatus includes: a transmitting device for transmitting a plurality of data; a receiving device for receiving the plurality of data; and a plurality of data lines for transmitting the plurality of data, wherein the transmitting device and the receiving device are connected to each other through the plurality of data lines, the transmitting device including a plurality of driver circuits for outputting the plurality of data to the plurality of corresponding data lines, respectively, the receiving device including: a plurality of terminating resistors connected to the plurality of corresponding data lines, respectively; a plurality of receiver circuits for detecting the plurality of data from the plurality of data lines, respectively; and at least one bias generating means for generating a bias voltage to be applied to the plurality of terminating resistors, the at least one bias generating means sets the bias voltage based on at least one potential among those of the plurality of data lines.

In one embodiment of the invention, at least one of the plurality of terminating resistors and the at least one bias generating means are connected through an electric resistance.

In another embodiment of the invention, at least one of the plurality of terminating resistors and the at least one bias generation means are connected through an amplifier.

In one aspect of the invention, a method for signal transmitting/receiving uses: a transmitting device for transmitting data; a receiving device for receiving the data; a data line for transmitting the data; and a supply line for transmitting a bias voltage which determines a voltage of the data line, the method including the steps of: generating the bias voltage at the transmitting device for outputting the bias voltage to the supply line; outputting the data through a terminating resistor in the receiving device, to the data line connected to the supply line; and detecting the data from the data line at the receiving device.

Thus, the invention described herein makes possible the advantages of providing a signal transmitting/receiving apparatus which achieves a stable data transmission even in the case where the ground potential of the transmitting device and the ground potential of the receiving device in the signal transmitting/receiving device are different or in the case where the signal transmitting/receiving device is operated under a supply voltage in the receiving device higher than that in the transmitting device.

These and other advantages of the present invention will become apparent to those skilled in the art upon reading and understanding the following detailed description with reference to the accompanying figures.

DETAILED DESCRIPTION

A first embodiment and a second embodiment of a signal transmitting/receiving apparatus according to the present invention will be explained first in reference to FIGS. 1A through 2B.

The fundamental features of the first and second embodiments of a transmitting/receiving apparatus according to the present invention are summarized in paragraphs 1) and 2) below. Otherwise the first and second embodiments of the transmitting/receiving apparatus according to the present invention basically have the same structure as the conventional apparatuses.

1) Transmission paths in accordance with a transmitting/receiving apparatus of the first and second embodiments of the present invention include a data line and a supply line for transmitting a bias voltage for the data line. In the case where a pair of differential lines are used for the data line, there are at least three transmission paths connecting a transmitting device and a receiving device. If a single line is used for the data line, there are at least two transmission paths connecting the transmitting device and the receiving device. A control line may be used in conjunction with the transmission paths (a pair of differential lines or a single line) as necessary.

2) The transmitting device includes a bias generating circuit 2, which applies a bias voltage to the receiving terminal. The bias voltage is transmitted via the supply line running parallel to the data line.

(Embodiment 1)

Figure 1A:
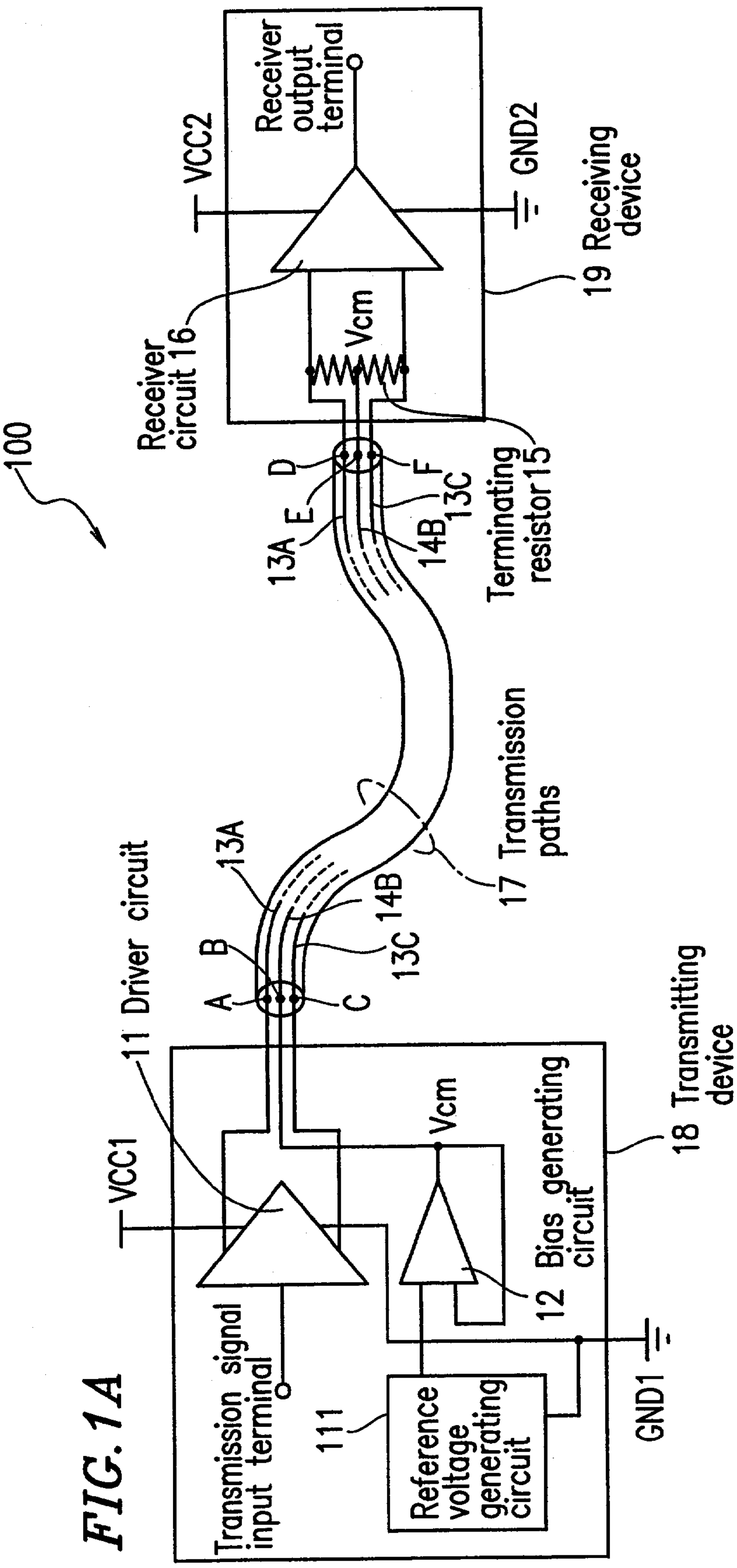
FIG. 1A is a diagram showing a configuration of a signal transmitting/receiving apparatus according to a first embodiment of the present invention.
Figure 1B:
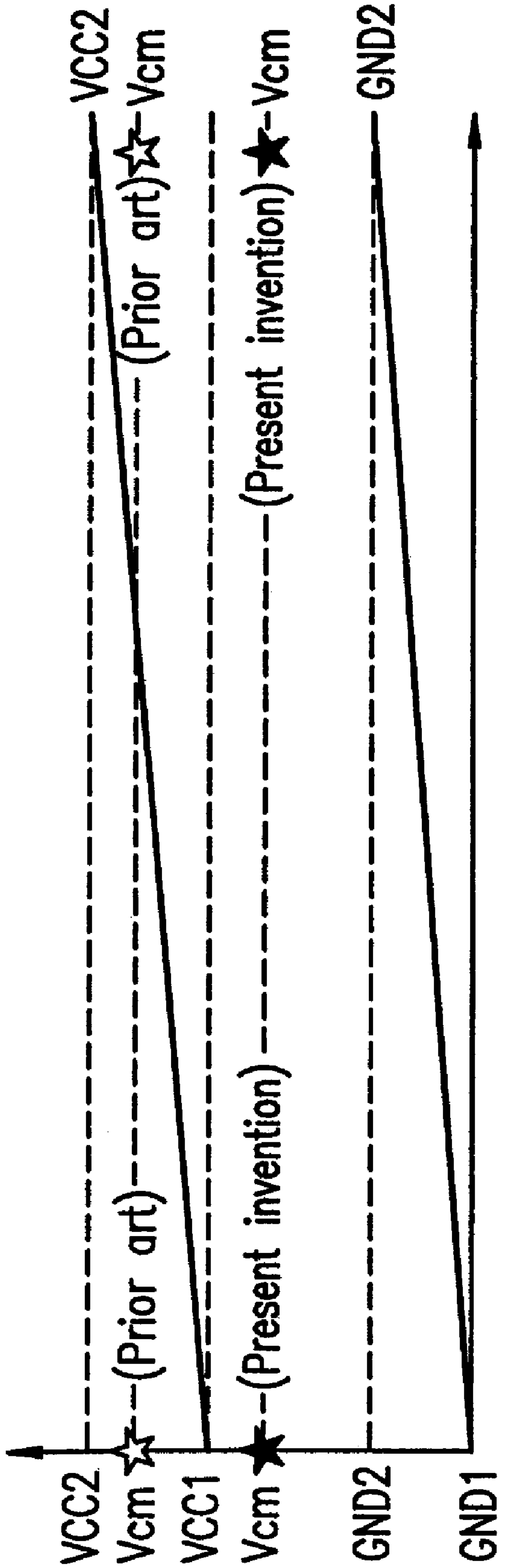
FIG. 1B is a diagram showing the ground potential difference between the transmitting device and the receiving device according to the first embodiment of the present invention.

FIGS. 1A and 1B illustrate the first example of a signal transmitting/receiving apparatus according to the present invention. FIG. 1A shows a configuration of a signal transmitting/receiving apparatus for solving the problems associated with a difference in ground potentials between the transmitting device and the receiving device in a signal transmitting/receiving apparatus.

A signal transmitting/receiving apparatus 100 of FIG. 1A is configured so that a transmitting device 18 and a receiving device 19 are connected through transmission paths 17. The transmission paths 17 include a pair of differential lines 13A and 13C, which are data lines for transmitting data, and a supply line (a bias voltage transmission path) 14B for transmitting a bias voltage which determines the voltage of the pair of differential lines 13A and 13C. The pair of differential lines 13A and 13C and the supply line 14B are connected to the transmitting device 18 and the receiving device 19 through, e.g., connecting terminals A through F. The transmitting device 18 includes a driver circuit 11 for transmitting data and a bias generating circuit 12 for generating a bias voltage and for transmitting the bias voltage to the receiving device 19. The receiving device 19 includes a terminating resistor 15 for terminating the pair of differential lines 13A and 13C and a receiver circuit 16 for detecting data transmitted from the transmitting device 18. In the receiving device 19, the pair of differential lines 13A and 13C are connected to the supply line 14B through the terminating resistor 15.

The function/effects according to the configuration of the present embodiment will be now explained in reference to the conventional problems.

FIG. 1A illustrates the case where the ground potential GND1 of the transmitting device 18 and the ground potential GND2 of the receiving device 19 are different. Specifically, this represents the case where the ground potential GND2 of the receiving device 19 is higher than the ground potential GND1 of the transmitting device 18. Even in such a case, a current can flow in the signal transmitting/receiving apparatus 100 according to the present invention because the intermediate voltage Vcm of the pair of differential lines 13A and 13C is lower than the supply voltage VCC1 of the driver circuit 11.

Figure 9A:
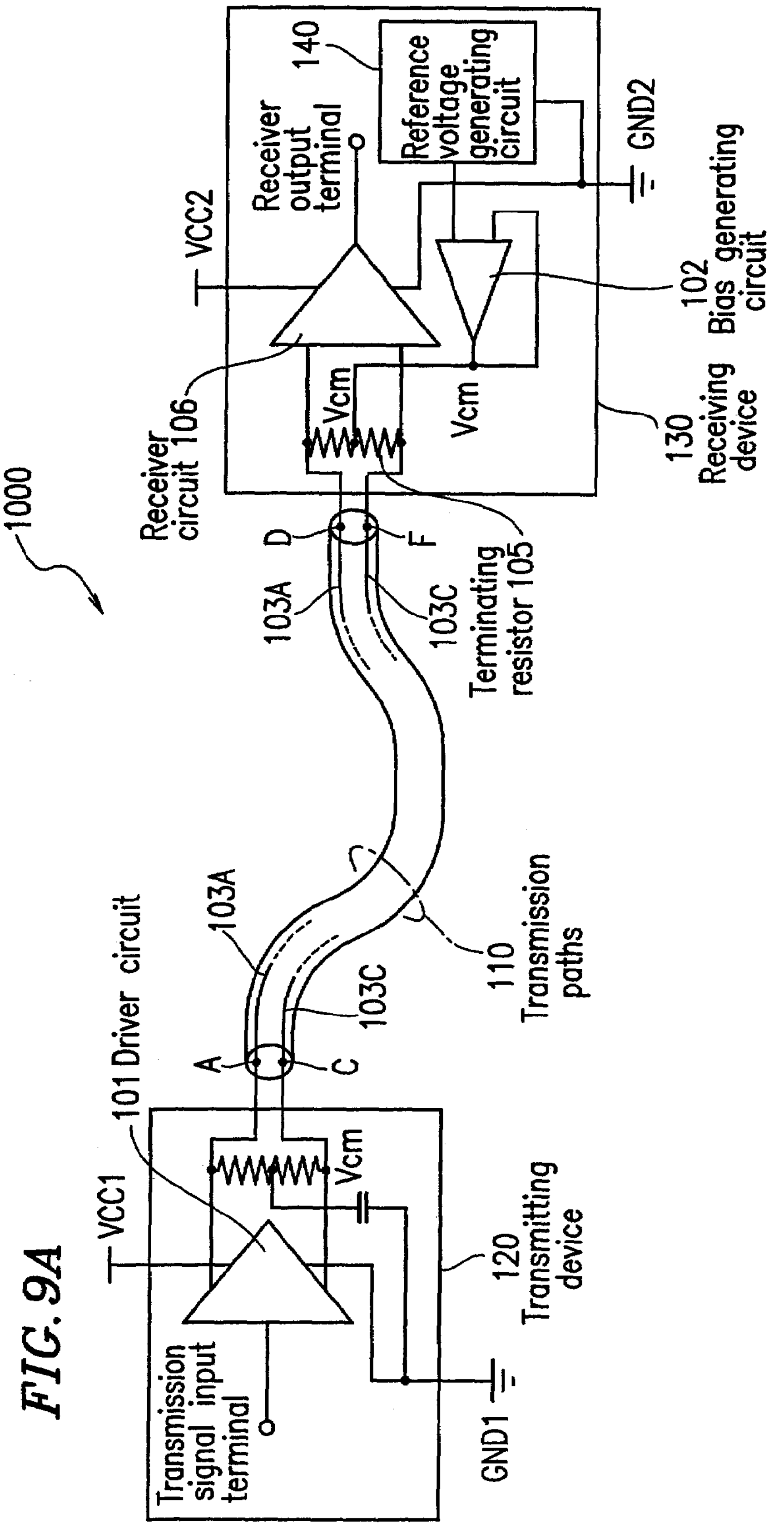
FIG. 9A is a diagram showing a configuration of a conventional signal transmitting/receiving apparatus.
Figure 9B:
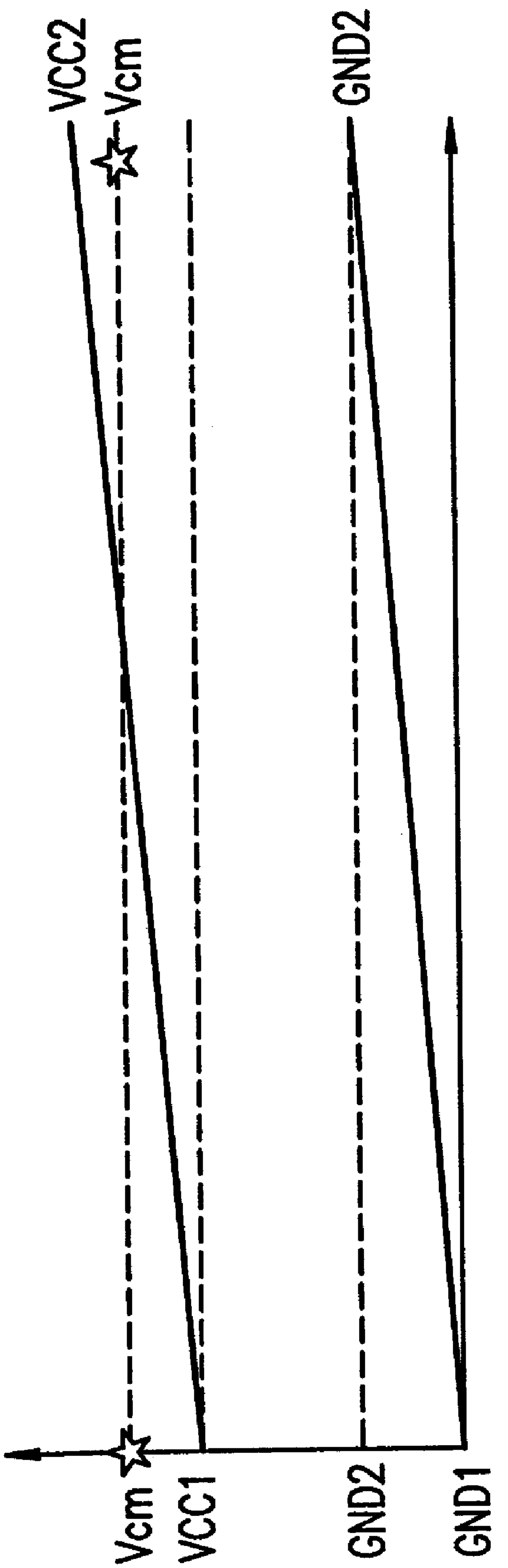
FIG. 9B is a diagram showing the ground potential difference between the transmitting device and the receiving device in a conventional, signal transmitting/receiving apparatus.

The difference between the present invention and a conventional apparatus will be readily understood by comparing FIGS. 1B and 9B. As shown in FIG. 9B, the intermediate potential Vcm generated in the bias generating circuit 102 (FIG. 9A) in the receiving device 130 appears higher (e.g., 0.5 V to 1.0 V) than the ground potential GND1 of the transmitting device 120. If the intermediate potential Vcm generated in the bias generating circuit 12 is sent to the receiving device 19 through the supply line 14B running along the pair of differential lines 13A and 13C, the midpoint potential of the pair of differential lines 13A and 13C is determined via the terminating resistor 15, so as to be equal to Vcm at the transmitting device 18. The reason for this is as follows: when the current flowing through the pair of differential lines 13A and 13C (which is returned by the terminating resistor 15 as it reaches the receiving device 19) is equal, the supply line 14B connected at the midpoint of the terminating resistor 15 only supplies a bias voltage from a DC perspective, and no current flows. Therefore, the influence of the resistance drop on the transmission path 17 can be ignored.

It is also possible, within the scope of the examples of the present invention to set the intermediate potential Vcm slightly higher so as to address a slight current which flows due to the imbalance of the capacitance and the resistance of the differential lines 17 or the imbalance of the differential driver circuit 11, thereby setting the midpoint potential of the pair of differential lines 13A and 13C of the transmitting device 18 at a desirable optimum level.

Accordingly, if the intermediate potential Vcm is set at 2.0 V in the transmitting device 18, the midpoint potential of the pair of differential lines 13A and 13C at the transmitting device 18 will be 2.0 V, which is almost the same as the intermediate potential Vcm. Therefore, unlike in the conventional apparatuses, Vcm does not exceed the supply voltage VCC1=2.5 V, thereby making it possible to apply a stable current to the output terminals A and C.

As described above, according to the present embodiment, signal transmissions/receptions can be carried out efficiently, even in the case where the transmitting device 18 is a floor model VCR whose power is supplied from an outlet and the corresponding receiving device 19 is a video camera operating by a battery (in which the power is supplied from the internal battery, and the ground of the video camera is only connected to the housing of the video camera, and thus the ground of the camera will be a ground potential GND2, which may inevitably be different from the ground potential of the outlet), or in the case where the power is supplied from the above floor model VCR to the above video camera through a cable (which is particularly represented by IEEE 1394 and the like), where the ground potential GND2 of the video camera may range about 0.5 V to 1.0 V higher (GND2=GND1+0.5 V to 1.0 V) than the ground potential GND1 of the floor model VCR.

(Embodiment 2)

Figure 2A:
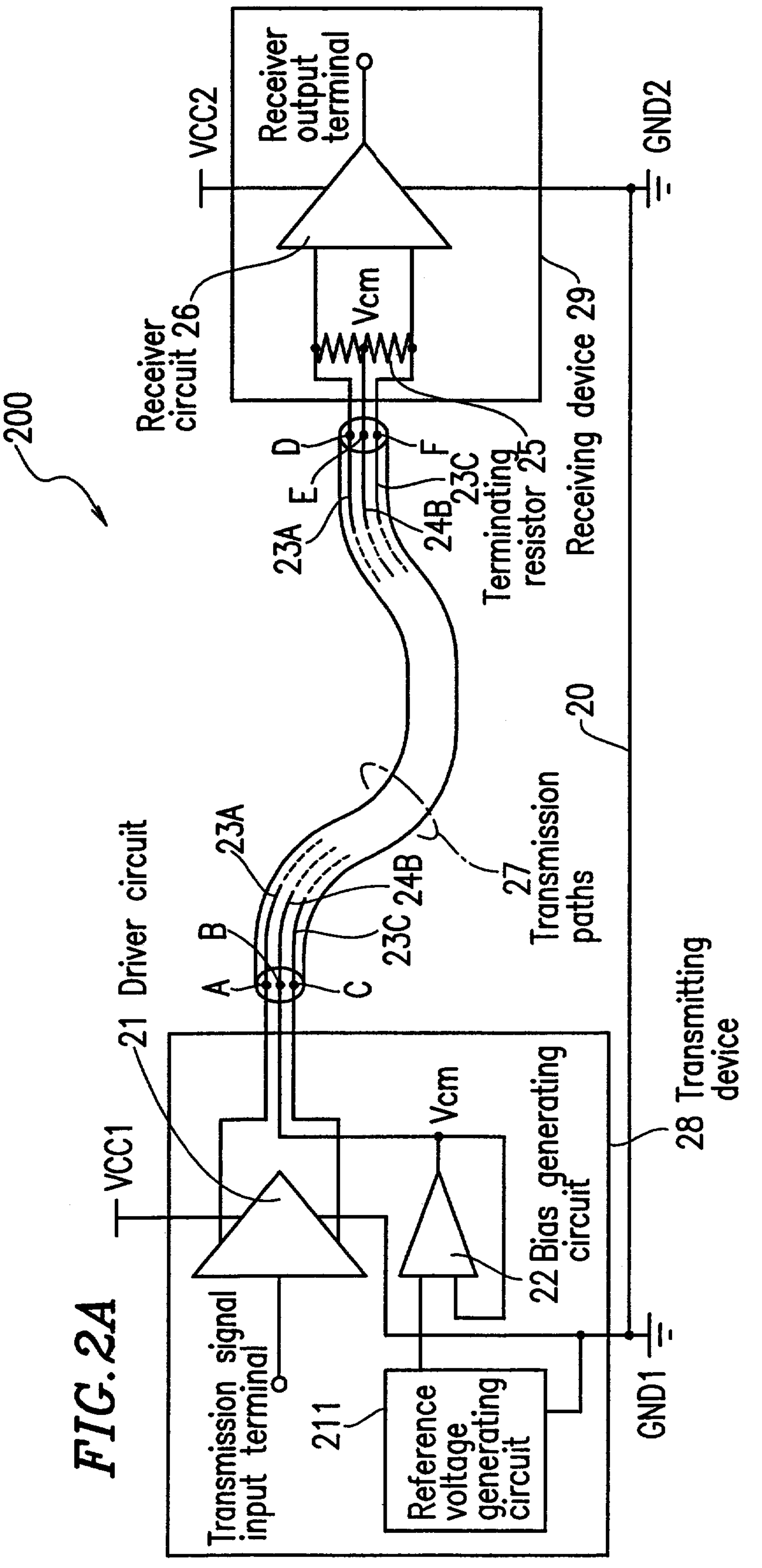
FIG. 2A is a diagram showing a configuration of a signal transmitting/receiving apparatus according to a second embodiment of the present invention.
Figure 2B:
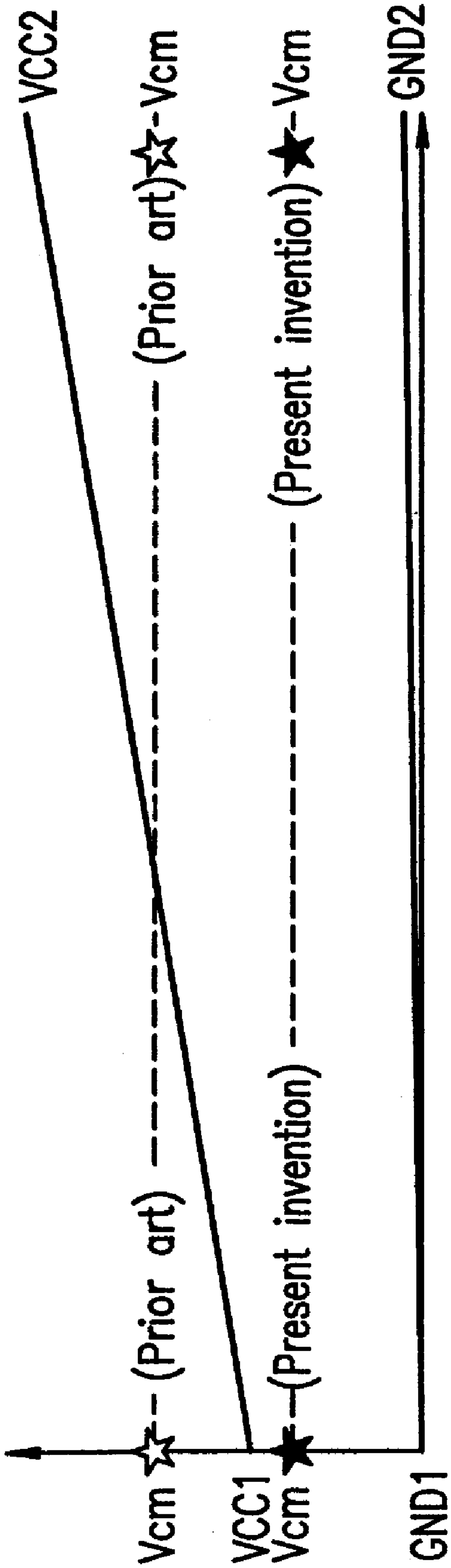
FIG. 2B is a diagram showing the ground potential difference between the transmitting device and the receiving device according to the second embodiment of the present invention.

FIGS. 2A and 2B illustrate the second embodiment of a signal transmitting/receiving apparatus according to the present invention. This is the case where the supply voltage VCC1 of a transmitting device 28 and the supply voltage VCC2 of a receiving device 29 are different. Specifically, this represents the case where the supply voltage VCC2 of the receiving device 29 is higher than the supply voltage VCC1 of the transmitting device 28. Even in such a case, a current can flow in a signal transmitting/receiving apparatus 200 according to the present invention because the intermediate voltage Vcm of the pair of differential lines 23A and 23C is lower than the supply voltage VCC1 of a driver circuit 21.

Figure 10A:
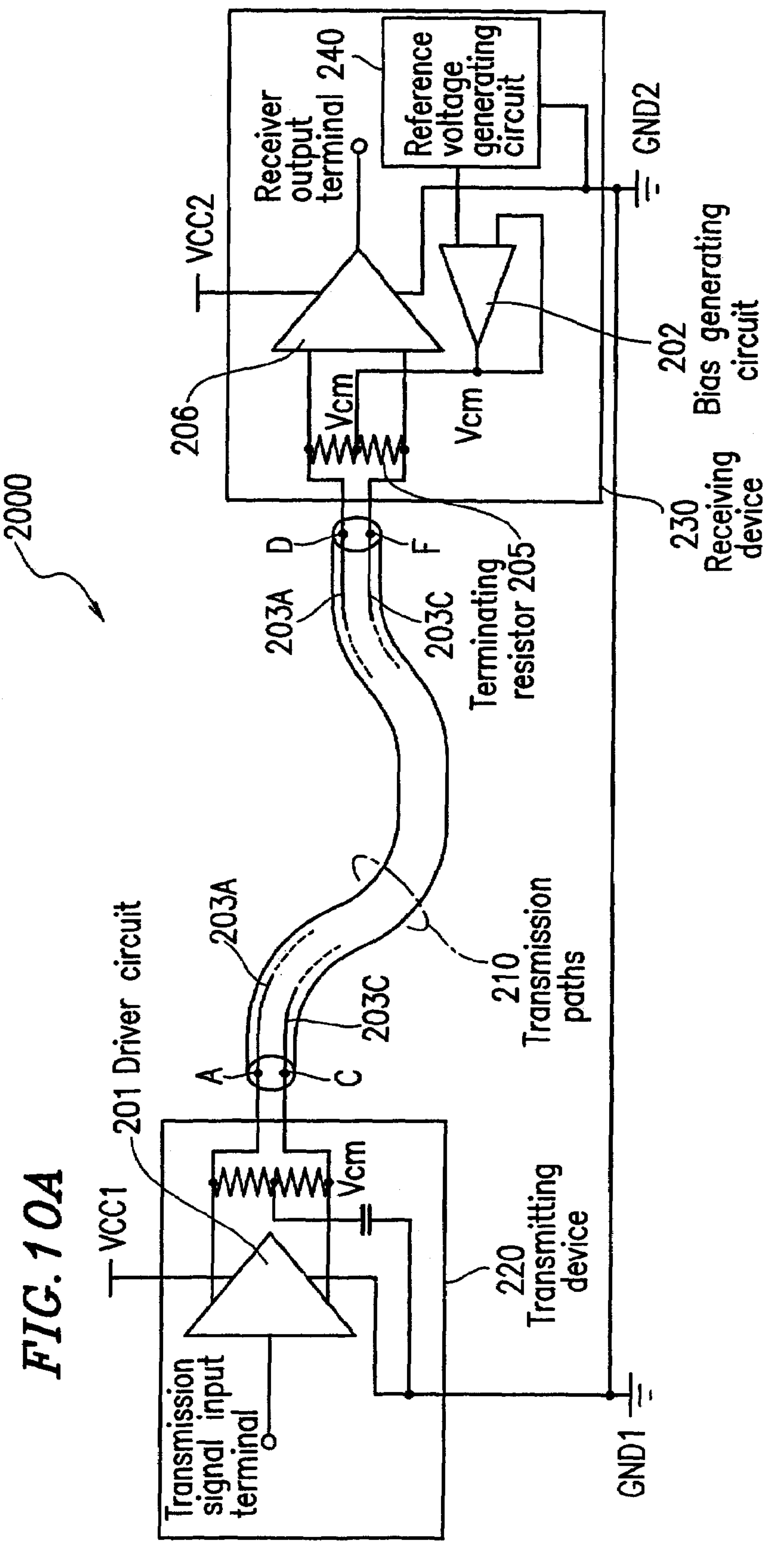
FIG. 10A is a diagram showing a configuration of a conventional signal transmitting/receiving apparatus.
Figure 10B:
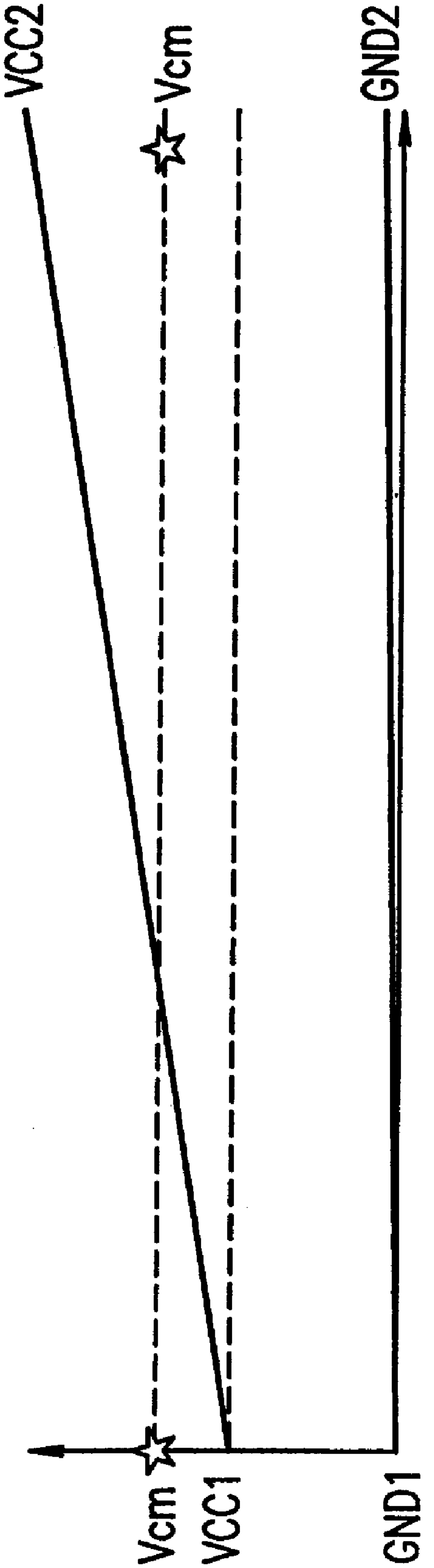
FIG. 10B is a diagram showing the ground potential difference between the transmitting device and the receiving device in a conventional signal transmitting/receiving apparatus.
Figure 11:
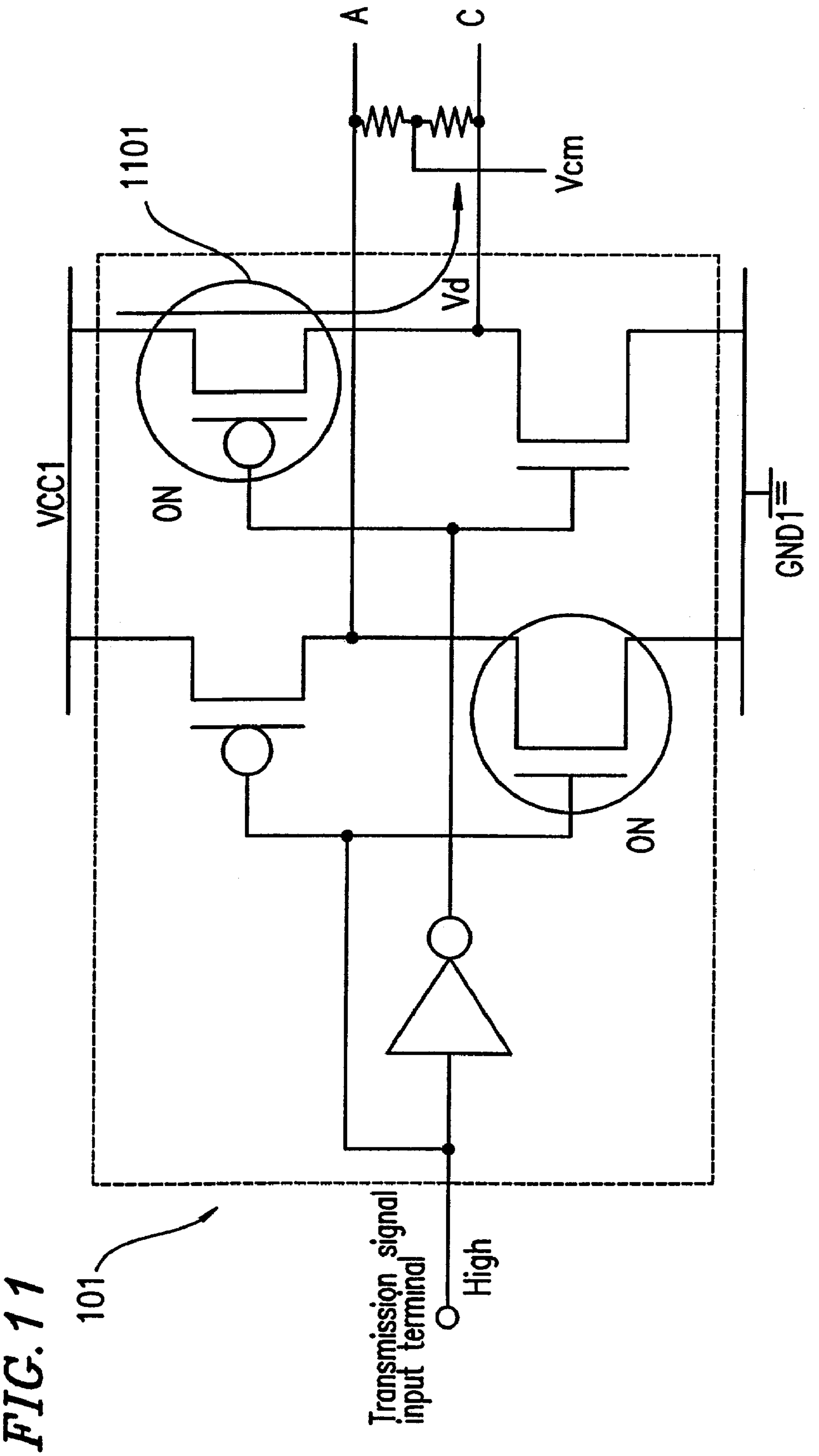
FIG. 11 is a diagram showing a configuration diagram of a driver circuit in the transmitting device according to a conventional signal transmitting/receiving apparatus.

The difference between the present invention and a conventional apparatus is apparent by comparing FIG. 2B and FIG. 10B. In a conventional apparatus, if a receiving device 230 is designed, supposing the intermediate potential Vcm is ½ of the supply voltage, Vcm will be, e.g., 2.5 V=(5 V×½). Therefore, those skilled in the art will readily understand that the supply voltage VCC1 of the transmitting device 220 should be set lower than 2.5 V if the design rule is 0.25 $\mu$m or less to achieve a high integration.

On the other hand, according to the present embodiment shown in FIG. 2A, a midpoint potential of a pair of differential lines 23A and 23C at the transmitting device 28 is determined based only on the transmitting device 28, as described in FIG. 1A. Therefore, according to the present embodiment; it is possible to apply a stable current from the driver circuit 21 to GDN2 of the receiving device 29, thereby making it possible to transmit/receive the data efficiently.

In the first and second embodiments of the present invention, a ground interconnect line 20 can be provided so as to connect a ground GND1 of the transmitting device and a ground GND2 of the receiving device, as shown in FIG. 2A. If the ground interconnect line 20 is provided, the potential difference between GND1 of the transmitting device 28 to the receiving device 29 becomes smaller, thereby supplying a more stable current from the transmitting device 28 and GND2 of the receiving device 29.

(Embodiment 3)

Figure 3A:
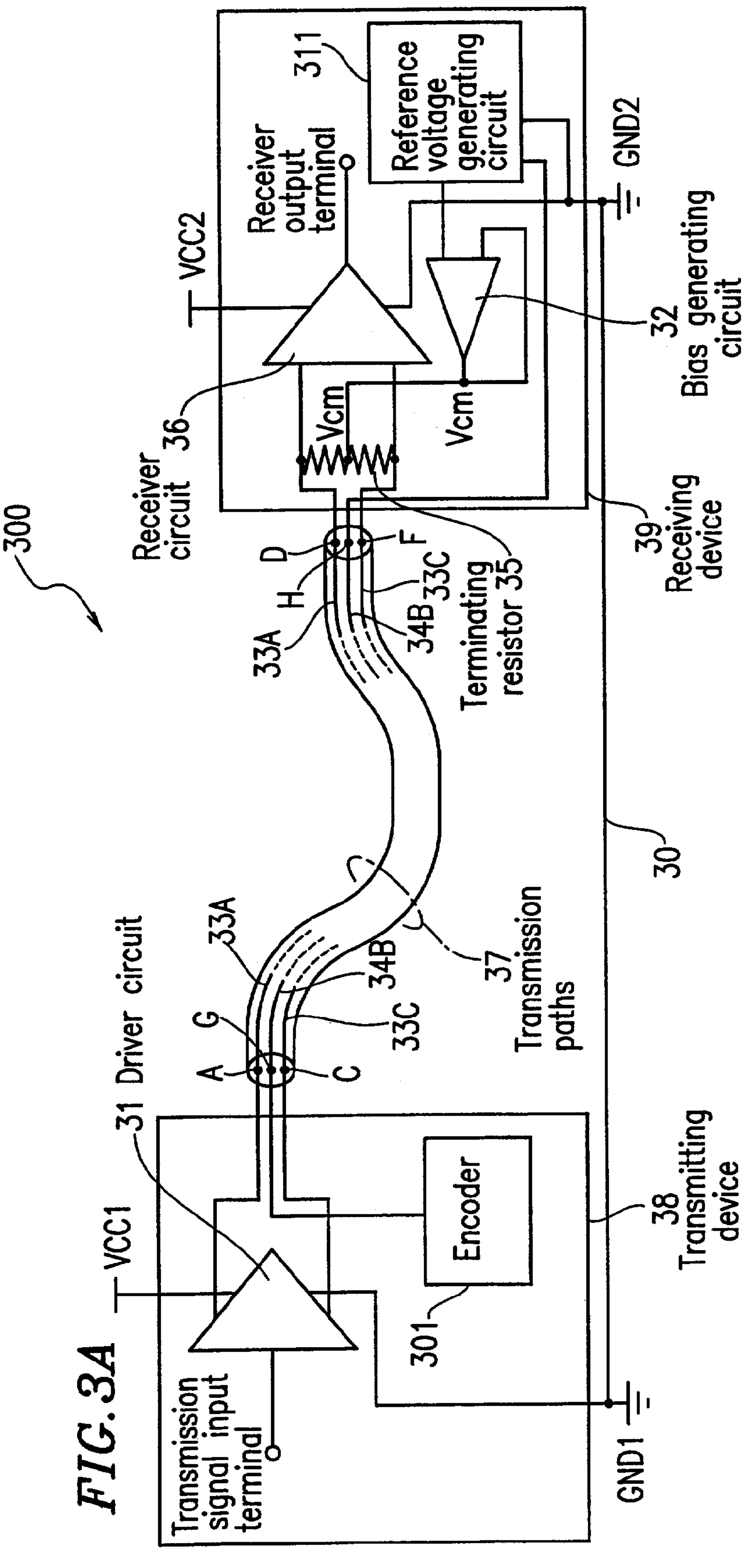
FIG. 3A is a diagram showing a configuration of a signal transmitting/receiving apparatus according to a third embodiment of the present invention.
Figure 3B:
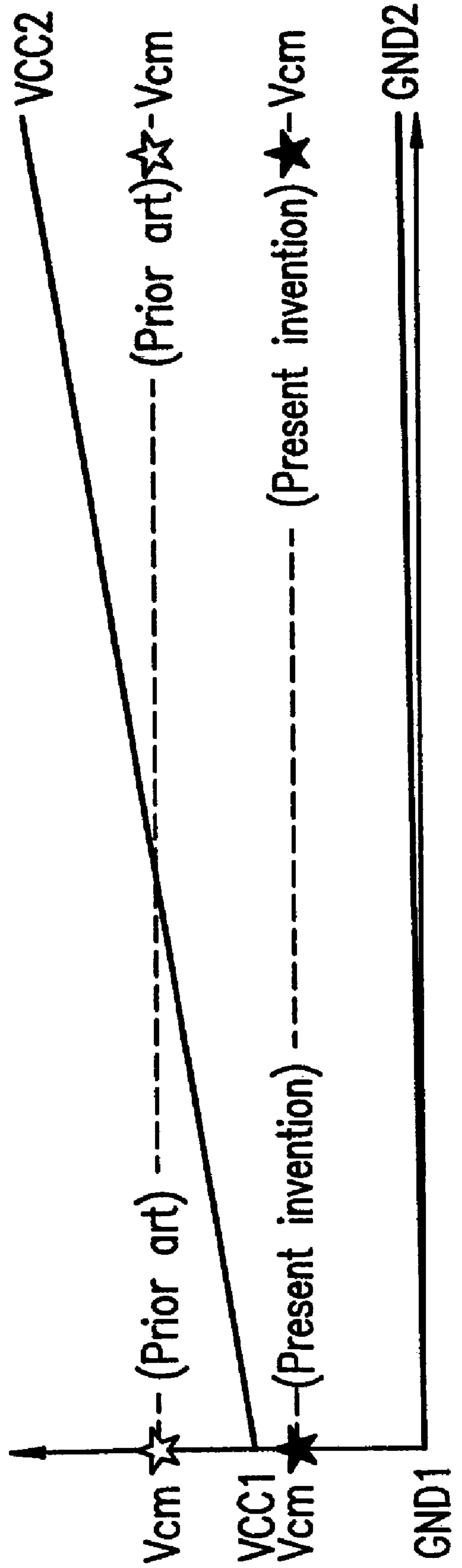
FIG. 3B is a diagram showing the ground potential difference between the transmitting device and the receiving device according to the third embodiment of the present invention.
Figure 4:
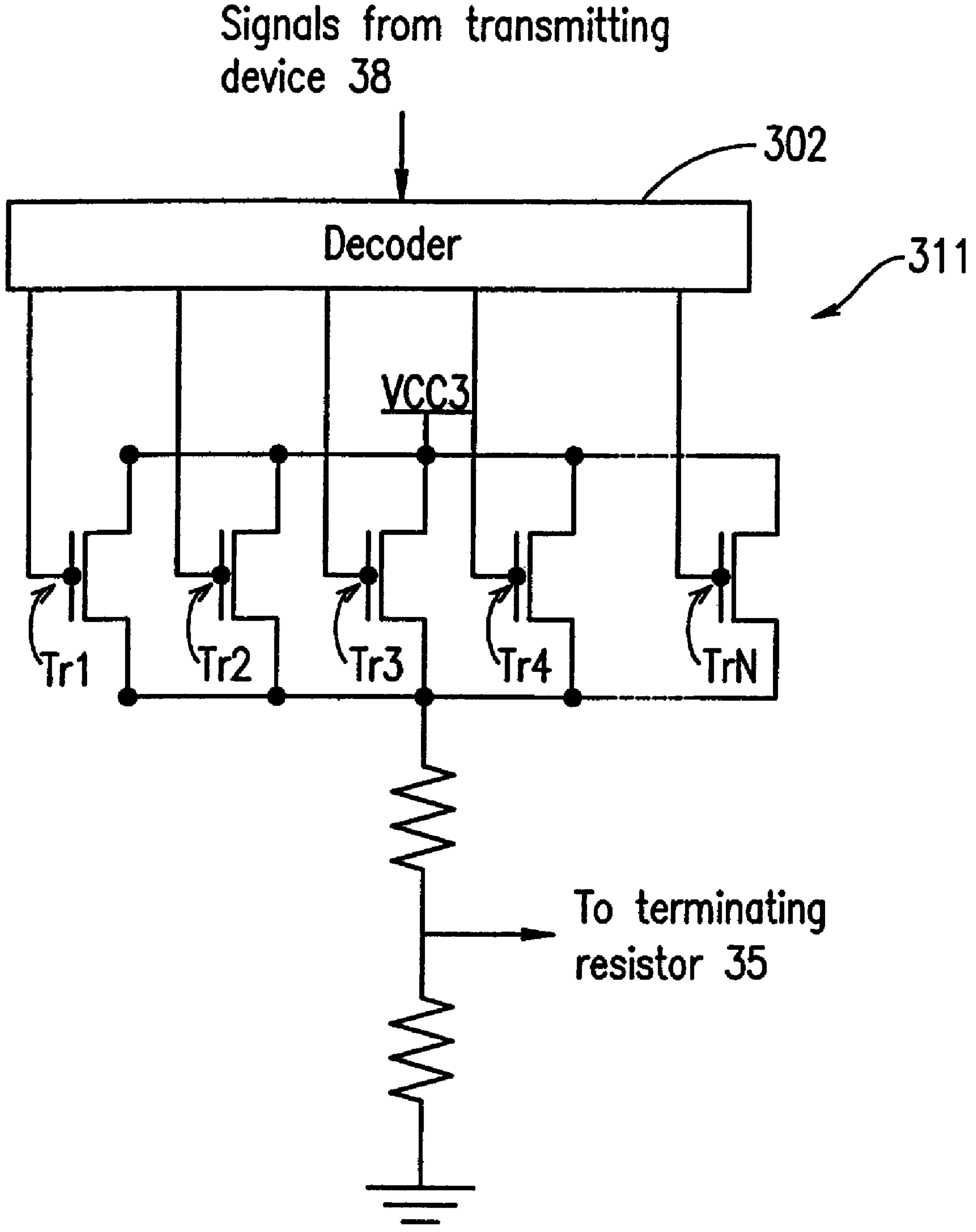
FIG. 4 is a diagram showing a configuration of a reference voltage generating circuit according to the third embodiment of the present invention.

FIGS. 3A, 3B and 4 show the third embodiment of a signal transmitting/receiving apparatus according to the present invention. In the third embodiment, a receiving device 39 is configured so as to include a reference voltage generating circuit 311 for generating a bias voltage, which is set by signals transmitted from a transmitting device 38. The remaining configuration is basically the same as in the first and second embodiments.

In the third embodiment of the present invention, when the power to a signal transmitting/receiving apparatus 300 is turned on, a signal for setting the bias voltage is transmitted from the transmitting device 38 to the reference voltage generating circuit 311 in the receiving device 39, thereby setting an appropriate bias voltage used for transmitting data from the transmitting device 38 to the receiving device 39. The appropriate bias voltage, thus set, makes it possible to stably transmit data from the transmitting device 38 to the receiving device 39.

The method in which the transmitting device 38 transmits the signal for setting the bias voltage and the method in which the reference voltage generating circuit 311 sets the bias voltage based on the signal, may be any such methods as known to those skilled in the art. For example, the signal transmissions/receptions may be carried out between an encoder 301 provided in the transmitting device 38 and a decoder 302 provided in the reference voltage generating circuit 311 (FIG. 4). As the method in which the reference voltage generating circuit 311 sets the bias voltage, a reference voltage generating circuit 311 as shown in FIG. 4 may be used.

The reference voltage generating circuit 311 shown in FIG. 4 includes a plurality of transistors Tr1, Tr2 . . . TrN between the power supply VCC3 of the reference voltage generating circuit 311 and a terminating resistor 35 of the receiving device 39. Each gate electrode of the transistors Tr1, Tr2 . . . TrN is connected to the decoder 302.

When the signal transmitted from the transmitting device 38 is input to the decoder 302 in the reference voltage generating circuit 311, the decoder 302 determines, based on the signal, which transistors among Tr1, Tr2 . . . TrN are to be in the ON state and which are to be in the OFF state. By setting the ON/OFF combination of each of the transistors Tr1, Tr2 . . . TrN in various patterns, the bias voltage can be set at an appropriate value. The resultant appropriate bias voltage makes it possible to stably transmit data from the transmitting device 38 to the receiving device 39.

Alternatively, a signal line 34B as shown in FIG. 3A or the pair of differential lines 33A and 33C may be used for transmitting the signal for setting the bias voltage from the transmitting device 38 to the receiving device 39. In the case where the pair of differential lines 33A and 33C are used, the total number of the transmission paths 37 connecting the transmitting device 38 and the receiving device 39 are reduced.

(Embodiment 4)

Figure 5A:
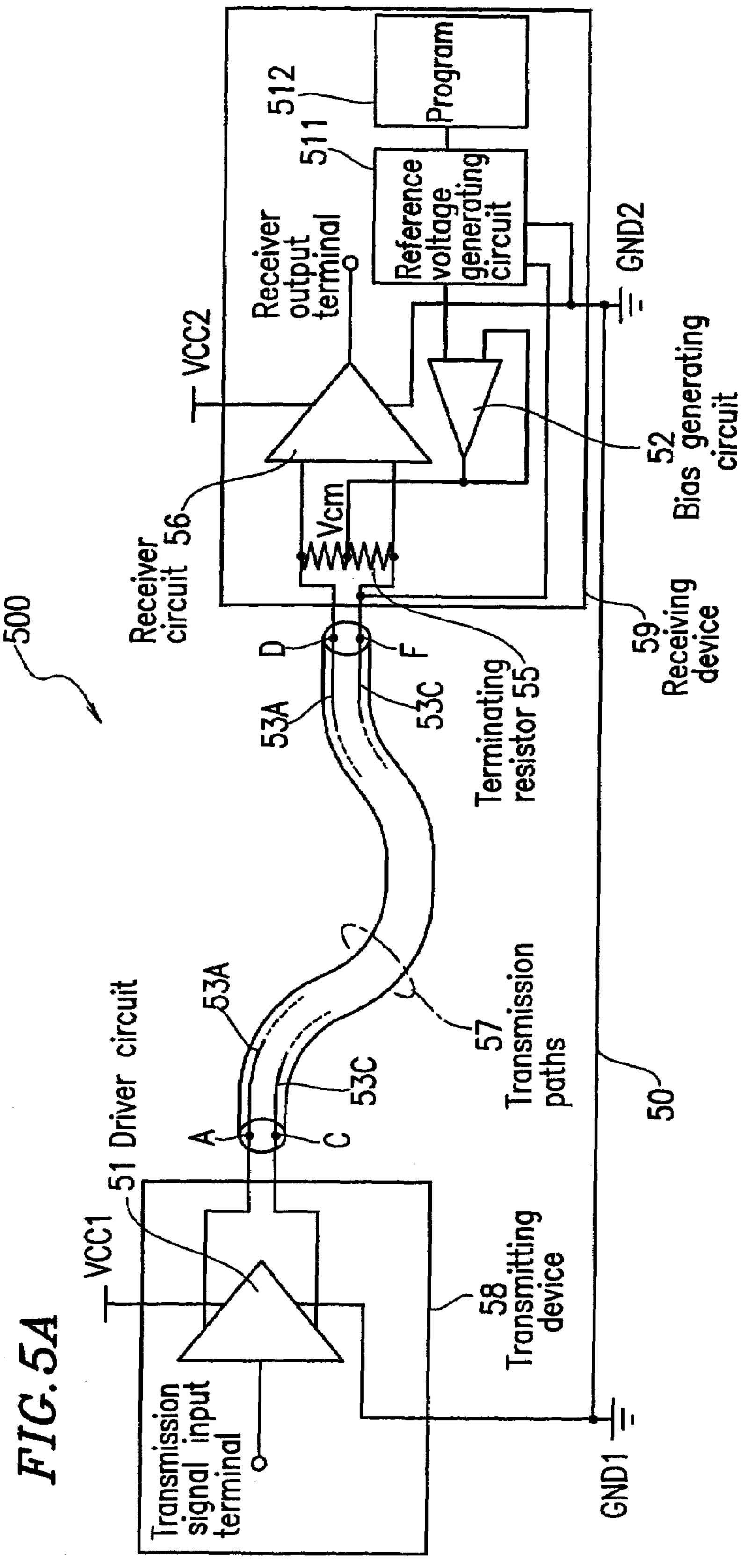
FIG. 5A is a diagram showing a configuration of a signal transmitting/receiving apparatus according to a fourth embodiment of the present invention.
Figure 5B:
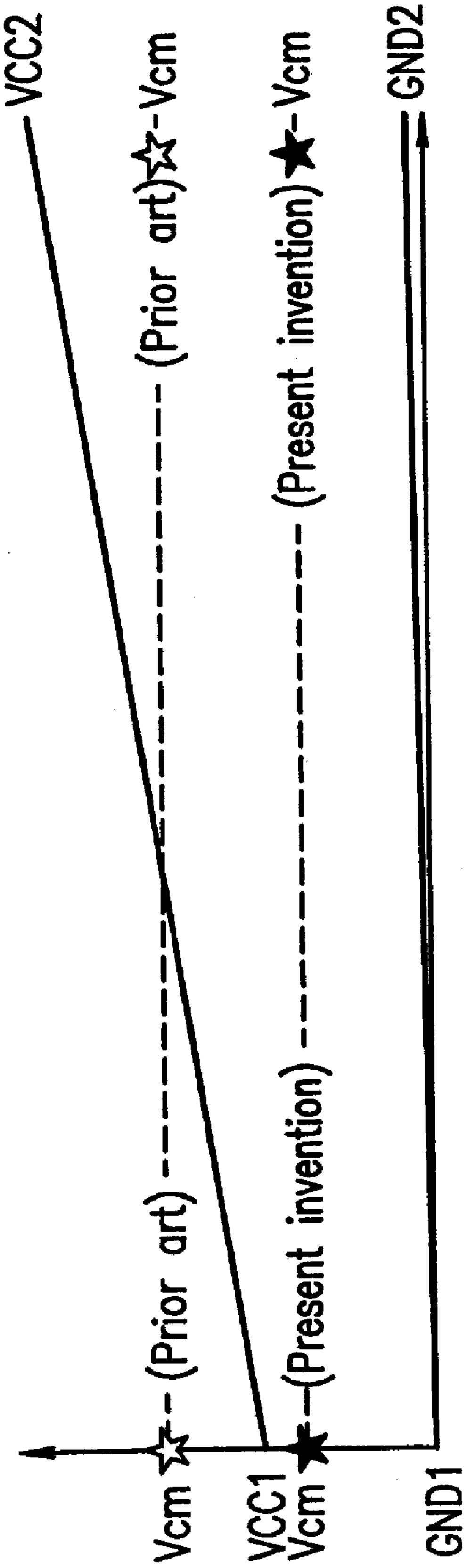
FIG. 5B is a diagram showing the ground potential difference between the transmitting device and the receiving device according to the fourth embodiment of the present invention.

FIGS. 5A and 5B show the fourth embodiment of a signal transmitting/receiving apparatus according to the present invention. A signal transmitting/receiving apparatus 500 of the fourth embodiment according to the present invention is configured so that a receiving device 59 includes a reference voltage generating circuit 511 for detecting a potential of a pair of differential lines 53A and 53C, thereby setting the bias voltage based on a predetermined program 512. Since the bias voltage is set by the receiving device 59, a supply line and a signal line are not provided between a transmitting device 58 and the receiving device 59.

The method in which the reference voltage generating circuit 511 detects the potential of the pair of differential lines 53A and 53C and the method for setting the bias voltage may be any method known to those skilled in the art. The remaining configuration is basically the same as in the first and second embodiments of the signal transmitting/receiving apparatus according to the present invention.

In the fourth embodiment of the present invention, it is preferable to first set a certain bias voltage in the reference voltage generating circuit 511, in order to detect the potential of the pair of differential lines 53A and 53C. The potential of the data transmitted from the transmitting device 58 is then detected so as to set an appropriate bias voltage based on the program 512. The resultant appropriate bias voltage makes it possible to stably transmit the data from the transmitting device 58 to the receiving device 59.

In the third embodiment and fourth embodiment of the present invention, ground interconnect lines 30 and 50 can be respectively provided so as to connect the ground GND1 of the transmitting device and the ground GND2 of the receiving device, as shown in FIGS. 3A and 5A. If the ground interconnect lines 30 and 50 are respectively provided, the potential difference between GND1 of the transmitting device and GND2 of the receiving device becomes smaller as shown in FIGS. 3B and 5B, thereby supplying a more stable current from the transmitting device to the receiving device.

As described in the BACKGROUND OF INVENTION, the above difference in the supply voltages (VCC2−VCC1) is derived from an inevitable requirement of the system (in the embodiment of signal transmitting/receiving apparatuses incorporated in digital video disc apparatuses and the like) as described below. This means the present embodiment of the invention can solve a very significant problem.

Figure 6:
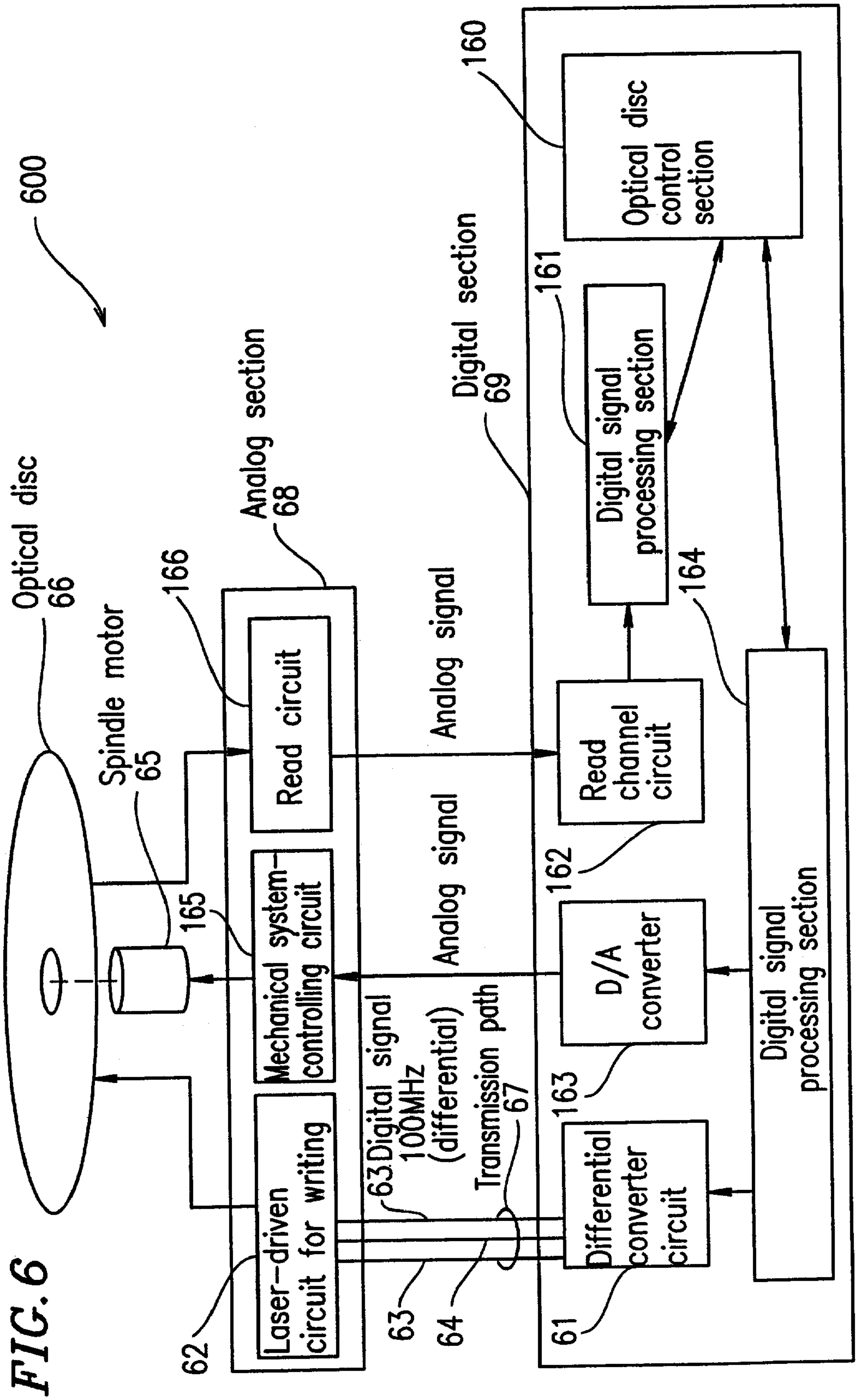
FIG. 6 is a schematic diagram of a configuration of a digital video disc incorporating the present invention.

FIG. 6 is a schematic diagram showing a configuration of a digital video disc apparatus 600 incorporating the signal transmitting/receiving apparatus of the present invention. The digital video disc apparatus 600 incorporates the signal transmitting/receiving apparatus of the present invention for the data transmission between a differential converter circuit 61 in a digital section 69 and a laser-driven circuit for writing 62 in an analog section 68. The RPM of an optical disc 66 are controlled by a mechanical system-controlling circuit 165 so as to be driven by a spindle motor 65 at a predetermined revolution. A read circuit 166 irradiates laser light onto the tracks of the optical disc 66, whereby data stored in the track is read. The output of the read circuit 166 is input to a read channel circuit 162 as an analog signal. The data written in the optical disc 66 is transmitted from the differential converter circuit 61 to the laser-driven circuit for writing 62 through transmission paths 67, and then written in the optical disc 66 by using a laser for writing (not shown).

Figure 12:
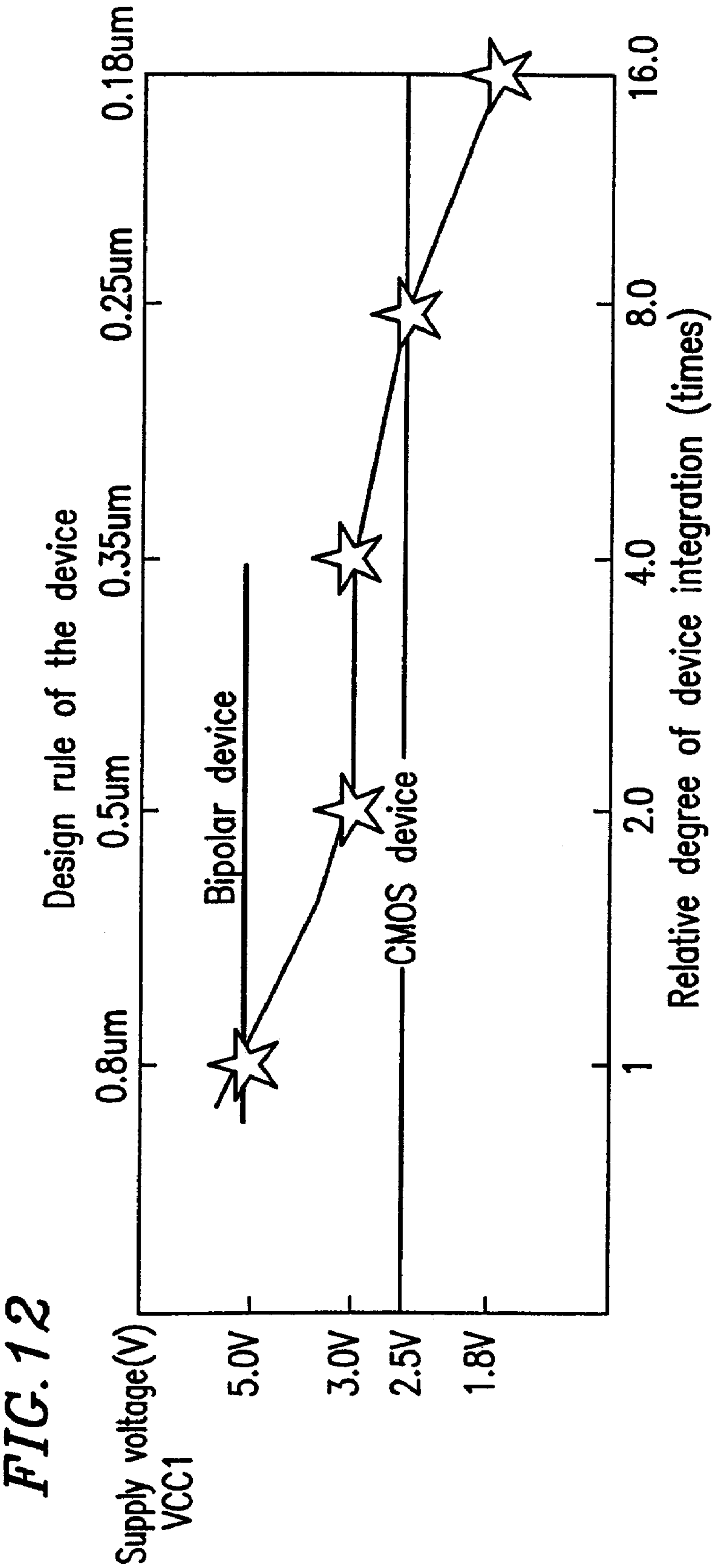
FIG. 12 is a diagram showing the relationship between the degree of integration of CMOS devices or bipolar devices and a supply voltage.

As shown in FIG. 6, in the case where the transmitting device is a signal processing large-scale integration circuit (LSI) (the digital sections) 69 and the receiving device is a servomotor controlling IC (the analog sections) 68, there is a trend towards developing highly integrated single-chip transmitting devices with a view to reducing the cost and saving the mounting area required of the apparatus by utilizing the leading-edge CMOS device technologies. Therefore, as shown in FIG. 12, the supply voltage of CMOS devices has been reduced, generation by generation, from 5.0 V to 3.0 V, 3.0 V to 2.5 V, and 2.5 V to 1.8 V.

On the other hand, in the case of the IC 68 which controls the servomotor of the receiving device, the supply voltage has not been changed with successive generations, being constant at 5.0 V. This is because the IC 68 is a bipolar device, which is an analog circuit formed of semiconductors driving mechanical systems such as a servomotor. Moreover, since the IC 68 is seldom required to incorporate added a new function in each product generation, its design is unchanged for five years or so, once designed. Thus, it is not very practical to change the circuits in the receiving device. Therefore, the unavoidable problem arises when the supply voltage VCC2 of the receiving device is higher than the supply voltage VCC1 of the transmitting device in a signal transmitting/receiving apparatus used in a high-speed servomotor-controlled IC which is necessary in a optical disc driving apparatus and the like (as represented by a digital video disc apparatus, etc.). The present invention provides a low-cost, high-performance signal transmitting/receiving apparatus, which solves such a problem.

(Embodiment 5)

Figure 7:
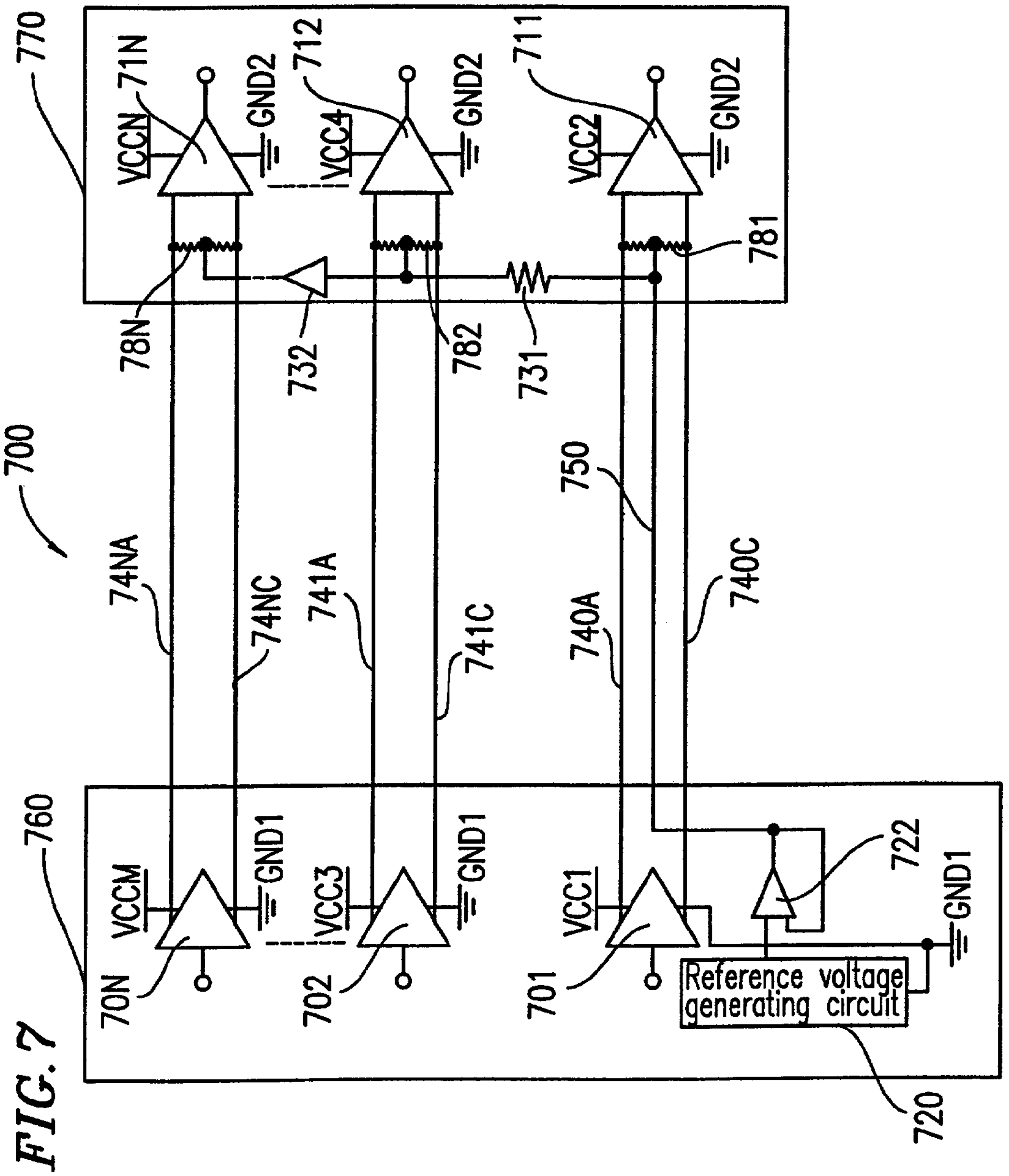
FIG. 7 is a diagram showing a configuration of a signal transmitting/receiving apparatus according to a fifth embodiment of the present invention.
Figure 8A:
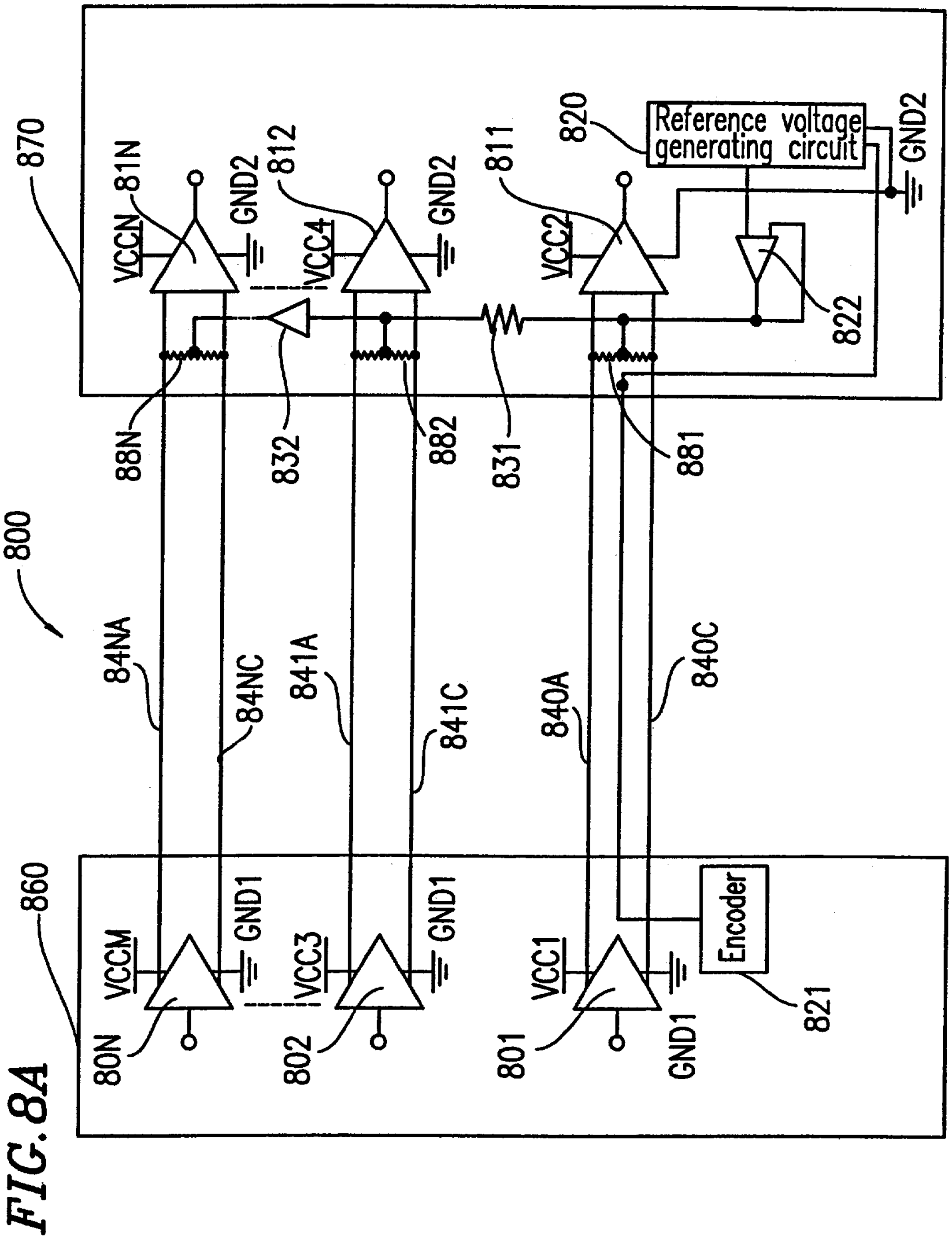
FIG. 8A is a diagram showing a configuration of a signal transmitting/receiving apparatus according to a fifth embodiment of the present invention.
Figure 8B:
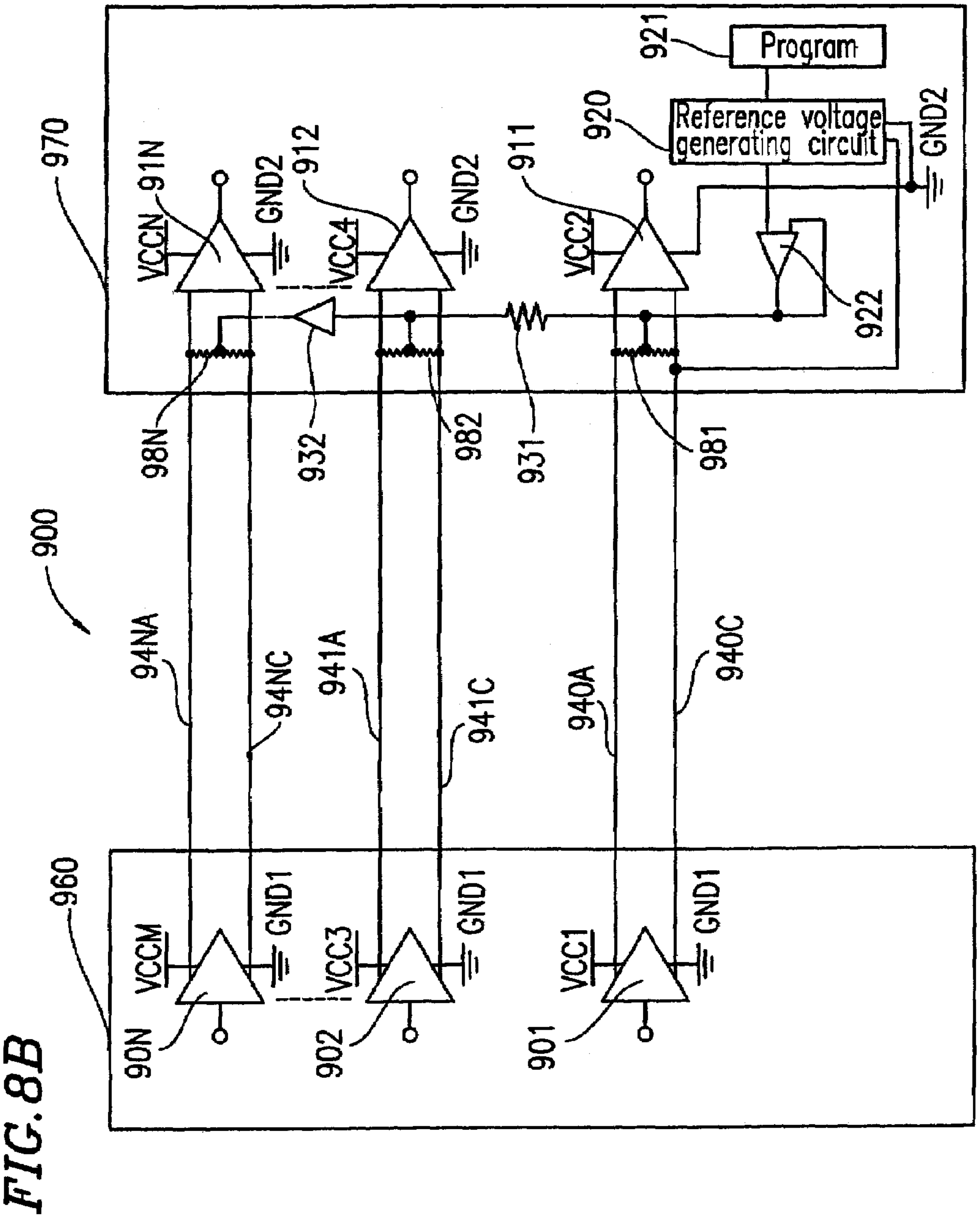
FIG. 8B is a diagram showing a configuration of a signal transmitting/receiving apparatus according to a fifth embodiment of the present invention.

FIGS. 7, 8A and 8B show the fifth embodiment of a signal transmitting/receiving apparatuses 700, 800 and 900 according to the present invention. In data transmission between a transmitting device and a receiving device, a plurality of pairs of differential lines maybe provided in order to transmit a different type of data (as in the embodiment of the digital video disc apparatus 600 shown in FIG. 6). In such a case, it may be required to set a different bias voltage for each pair of differential lines. When a plurality of reference voltage generating circuits corresponding to the plurality of pairs of differential lines, in order to set each bias voltage of the plurality of the differential lines, a problem arises because the entire configuration size of the signal transmitting/receiving apparatus increases, and the cost of the apparatus also increases. Therefore, as shown in FIG. 7, each bias voltage of the plurality of pairs of differential lines 740A, 740C, 741A, 741C . . . 74NA and 74NC may be commonly set by a single reference voltage generating circuit 720 and a single bias generating circuit 722 provided in a transmitting device 760 and a single supply line 750 via the terminating resistors 781, 782 . . . 78N. If the appropriate bias voltage for each pair of differential lines varies, the differences can be adjusted by providing the corresponding numbers of a resistor 731 and an amplifier 732 between the supply line 750 and each terminating resistor 781 to 78N.

Similarly in the case of the third embodiment of the present invention where the reference voltage generating circuit sets the bias voltage based on the signal from the transmitting device, a single reference voltage generating circuit 820 and a single bias generating circuit 822 may be provided in a receiving device 870 as shown in FIG. 8A, thereby commonly setting the respective bias voltage of a plurality of differential lines 840A, 840C, 841A, 841C . . . 84NA and 84NC via terminating resistors 881, 882 . . . 88N.

Furthermore, as shown in FIG. 8B, it may be configured so that a reference voltage generating circuit 920 (as shown in the fourth embodiment of the present invention) sets a bias voltage based on a program 921, wherein the respective bias voltage of the plurality of pairs of differential lines 940A, 940C, 941A, 941C . . . 94NA and 94NC may be commonly set via terminating resistors 981, 982 . . . 98N using a single reference voltage generating circuit 920 and a single bias generating circuit 922.

Also in the embodiment illustrated in FIGS. 8A and 8B, if there is a difference between the appropriate bias voltage for each pair of differential lines, a corresponding number of resistors 831 and 931 and amplifiers 832 and 932 may be provided.

Furthermore in the present embodiment, a ground interconnect line may be provided, as necessary, for connecting GND1 of the transmitting device and GND2 of the receiving device.

It should be noted that the signal transmitting/receiving apparatuses 700, 800 or 900 shown in FIG. 7A, 8A or 8B include only one reference voltage generating circuit 720, 820 or 920, the number of the reference voltage generating circuit is not limited thereto. Two or more reference voltage generating circuits may be included in order to set each bias voltage at an appropriate value. Also, any number of the driver circuits 701 to 70N, 801 to 80N, 901 to 90N in transmitting devices 760, 860 and 960 and any number of the receiver circuits 711 to 71N, 811 to 81N, 911 to 91N in receiving devices 770, 870 and 970 may be set in accordance with each embodiment of the signal transmitting/receiving apparatus.

As described above, by commonly setting the respective bias voltage for a plurality of differential lines, the configuration of the entire signal transmitting/receiving apparatus becomes simple, and therefore the cost of the apparatus is maintained low.

While cables are illustrated for transmission paths in the embodiments of the signal transmitting/receiving apparatus according to the present invention, any lines can also be used (e.g., transmission paths may be provided on the substrate). In this case, the substrate including the lines is preferably flexible as the cables.

The present invention makes it possible to transmit data stably even in the case where the signal transmitting/receiving device is operated under a supply voltage of the receiving device higher than the supply voltage of the transmitting device, or in the case where the ground potential of the transmitting device and the ground potential of the receiving device in the signal transmitting/receiving device are different, whereby a low-cost, high-performance signal transmitting/receiving apparatus is provided.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A signal transmitting/receiving apparatus, comprising:
- a transmitting device for transmitting a first data and a second data;
- a receiving device for receiving the first data and the second data;
- a data line for transmitting the first data and the second data;
- wherein the transmitting device and the receiving device are connected to each other through the data line,
- the transmitting device comprising:
  - a driver circuit for outputting the first data to the data line; and
  - a circuit for outputting the second data to the data line,
- the receiving device comprising:
  - a terminating resistor connected to the data line;
  - a receiver circuit for detecting the first data from the data line; and
  - a bias generating means for generating a bias voltage applied to the terminating resistor,
  - the bias generating means setting the bias voltage based on the second data from the data line, wherein;
  - the data line comprises a pair of differential lines; and
  - the terminating resistor short circuits between the pair of differential lines.

2. A signal transmitting/receiving apparatus according to claim 1, wherein the bias generating means comprises a bias generating circuit and a reference voltage generating circuit.

3. A signal transmitting/receiving apparatus according to claim 1, wherein the bias voltage is applied at substantially a midpoint of the terminating resistor.

4. A signal transmitting/receiving apparatus according to claim 1, further comprising a ground interconnect line for connecting a ground of the transmitting device and a ground of the receiving device.

5. A signal transmitting/receiving apparatus according to claim 4, wherein the ground interconnect line has flexibility.

6. A signal transmitting/receiving apparatus according to claim 1, wherein the data line has flexibility.

7. A transmitting device connected to a data line which transmits the first data and the second data to a receiving device, wherein:
- the receiving device comprises:
  - a terminating resistor connected to the data line;
  - a receiver circuit for detecting the first data from the data line; and
  - a bias generating means for generating a bias voltage to be applied to the terminating resistor based on the second data from the data line,
- the transmitting device comprising:
  - a driver circuit for outputting the first data to the data line; and
  - a circuit for outputting the second data to the data line, wherein;
  - the data line comprises a pair of differential lines; and
  - the terminating resistor short circuits between the pair of differential lines.

8. A transmitting device according to claim 7, wherein the bias generating means comprises a bias generating circuit and a reference voltage generating circuit.

9. A transmitting device according to claim 7, wherein the data line for transmitting the first data and the data line for transmitting the second data are different.

10. A transmitting device according to claim 7, further connected to a ground interconnect line for transmitting a ground potential of the transmitting device to the receiving device.

11. A transmitting device according to claim 7, wherein the bias voltage is applied at substantially a midpoint of the terminating resistor.

12. A receiving device connected to a data line which transmits first data and second data for receiving the first data and the second data from a transmitting device, the transmitting device comprising:

a driver circuit for outputting the first data to the data line; and a circuit for outputting the second data to the data line, the receiving device comprising:

a terminating resistor connected to the data line;

a receiver circuit for detecting the data from the data line; and a bias generating means for generating a bias voltage and outputting the bias voltage to the terminating resistor, wherein the bias generating means sets the bias voltage based on the second data from the data line, wherein;

the data line comprises a pair of differential lines; and the terminating resistor short circuits between the pair of differential lines.

13. A receiving device according to claim 12, wherein the bias generating means comprises a bias generating circuit and a reference voltage generating circuit.

14. A receiving device according to claim 12, wherein the data line for transmitting the first data and the data line for transmitting the second data are different.

15. A receiving device according to claim 12, wherein the bias voltage is applied at substantially a midpoint of the terminating resistor.

16. A receiving device according to claim 12, further connected to a ground interconnect line which transmits a ground potential of the transmitting device.

17. A signal transmitting/receiving apparatus, comprising:

a transmitting device for transmitting a plurality of first data and at least one second data;

a receiving device for receiving the plurality of first data and the at least one second data; and a plurality of data lines for transmitting the plurality of first data and the at least one second data, wherein the transmitting device and the receiving device are connected to each other through the plurality of data lines, the transmitting device comprising:

a plurality of driver circuits for outputting the plurality of first data to the plurality of corresponding data lines, respectively; and at least one circuit for outputting the at least one second data to the plurality of data lines, the receiving device comprising:

a plurality of terminating resistors connected to the plurality of corresponding data lines, respectively; and a plurality of receiver circuits for detecting the plurality of first data from the plurality of data lines, respectively, at least one bias generating means for generating a bias voltage to be applied to the plurality of terminating resistors, the at least one bias generating means setting the bias voltage based on the at least one second data from the plurality of data lines.

18. A signal transmitting/receiving apparatus according to claim 17, wherein at least one of the plurality of terminating resistors and the at least one bias generating means are connected through an electric resistance.

19. A signal transmitting/receiving apparatus according to claim 17, wherein at least one of the plurality of terminating resistors and the at least one bias generating means are connected through an amplifier.

20. A signal transmitting/receiving apparatus, comprising:

a transmitting device for transmitting a first data and a second data;

a receiving device for receiving the first data and the second data; and a data line for transmitting the first data and the second data, wherein the transmitting device and the receiving device are connected to each other through the data line, the transmitting device comprising:

a driver circuit for outputting the first data to the data line; and a circuit for outputting the second data to the data line, the receiving device comprising:

a terminating resistor connected to the data line;

a receiver circuit for detecting the first data from the data line; and a bias generating means for generating a bias voltage to be applied to the terminating resistor, the bias generating means setting the bias voltage based on the second data from the data line, wherein:

the data line for transmitting the first data and the data line for transmitting the second data are different;

the data line for transmitting the first data comprises a pair of differential lines; and the terminating resistor short circuits between the pair of differential lines.

21. A signal transmitting/receiving apparatus according to claim 20, wherein the bias generating means comprises a bias generating circuit and a reference voltage generating circuit.

22. A signal transmitting/receiving apparatus according to claim 20, wherein the bias voltage is applied at substantially a midpoint of the terminating resistor.

23. A signal transmitting/receiving apparatus according to claim 20, further comprising a ground interconnect line for connecting a ground of the transmitting device and a ground for the receiving device.

24. A signal transmitting/receiving apparatus according to claim 23, wherein the ground interconnect line has flexibility.

25. A signal transmitting/receiving apparatus according to claim 20, wherein the data line has flexibility.

* * * * *